United States Patent
Koganei et al.

(10) Patent No.: US 11,418,284 B2
(45) Date of Patent: Aug. 16, 2022

(54) ENCODING CIRCUIT, DECODING CIRCUIT, ENCODING METHOD, AND DECODING METHOD

(71) Applicant: FUJITSU LIMITED, Kawasaki (JP)

(72) Inventors: Yohei Koganei, Kawasaki (JP); Kiichi Sugitani, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 16/871,746

(22) Filed: May 11, 2020

(65) Prior Publication Data

US 2020/0366408 A1 Nov. 19, 2020

(30) Foreign Application Priority Data

May 14, 2019 (JP) .............................. JP2019-091371

(51) Int. Cl.
*H04L 1/18* (2006.01)
*H04L 1/00* (2006.01)
*H03M 13/29* (2006.01)

(52) U.S. Cl.
CPC ...... *H04L 1/0044* (2013.01); *H03M 13/2957* (2013.01); *H04L 1/0053* (2013.01); *H04L 1/0089* (2013.01)

(58) Field of Classification Search
None
See application file for complete search history.

(56) References Cited

U.S. PATENT DOCUMENTS

| 9,544,008 | B2* | 1/2017 | Miyoshi | H04L 1/0042 |
| 2003/0039229 | A1* | 2/2003 | Ostman | H04L 1/1845 370/335 |
| 2008/0163025 | A1 | 7/2008 | Djordjevic et al. | |
| 2008/0270876 | A1* | 10/2008 | Yokokawa | G06F 11/1008 714/800 |

(Continued)

FOREIGN PATENT DOCUMENTS

JP 2008-187706 A 8/2008

OTHER PUBLICATIONS

Fred Buchali et al., "Rate Adaptation and Reach Increase by Probabilistically Shaped 64-QAM: An Experimental Demonstration", Journal of Lightwave Technology, vol. 34, No. 7, pp. 1599-1609, Apr. 1, 2016(Total 11 pages).

(Continued)

*Primary Examiner* — Mujtaba M Chaudry
(74) *Attorney, Agent, or Firm* — Fujitsu Patent Center

(57) ABSTRACT

A method includes assigning a symbol corresponding to a value of each of bit strings in a frame among the symbols in a constellation of a multi-level modulation scheme, to bit strings, converting a value of each of the bit strings other than a first bit string such that a symbol closer to a center of the constellation is assigned more among symbols, generating a error correction code for correcting an error of bit strings to insert the error correction code into the first bit string, generating the first error correction code from the bit strings other than the first bit string among bit strings, in a first period in which the error correction code is inserted into the first bit string in a period of the frame, and generating the error correction code from a second bit string in another second period in the period of the frame.

8 Claims, 17 Drawing Sheets

(56) References Cited

U.S. PATENT DOCUMENTS

| | | | | |
|---|---|---|---|---|
| 2011/0103502 A1* | 5/2011 | Vitale | .................. | H04L 1/0041 |
| | | | | 375/261 |
| 2012/0198502 A1* | 8/2012 | Qin | .................... | H04N 21/2389 |
| | | | | 725/70 |
| 2012/0219282 A1* | 8/2012 | Koganei | ................. | H04L 25/14 |
| | | | | 398/1 |
| 2013/0216001 A1* | 8/2013 | Petrov | ................. | H03M 13/255 |
| | | | | 375/298 |
| 2014/0226682 A1* | 8/2014 | Becker | ............... | H04B 7/18523 |
| | | | | 370/474 |
| 2014/0229802 A1* | 8/2014 | Eroz | .................... | H03M 13/13 |
| | | | | 714/776 |
| 2016/0261368 A1* | 9/2016 | Maeda | ................. | H04L 1/0009 |

OTHER PUBLICATIONS

Udo Wachsmann et al., "Multilevel Codes: Theoretical Concepts and Practical Design Rules", IEEE Transactions on Information Theory, vol. 45, No. 5, pp. 1361-1391, Jul. 1999 (Total 31 pages).
Andreas Bisplinghoff et al., "Low-Power, Phase-Slip Tolerant, Multilevel Coding for M-QAM", Journal of Lightwave Technology, vol. 35, No. 4, pp. 1006-1014, Feb. 15, 2017 (Total 9 pages).
Yohei Koganei et al., "Multilevel Coding with Spatially-Coupled Codes for beyond 400Gbps Optical Transmission", OFC 2018, 2018 Optical Society of America, Tu3C.2, 2018 (Total 3 pages).

* cited by examiner

FIG. 6

| Q VALUE | | | | | | | | | | | |
|---|---|---|---|---|---|---|---|---|---|---|---|
| LEVEL-2 | LEVEL-1 | LEVEL-0 | | \<SECOND QUADRANT\> | | | | \<FIRST QUADRANT\> | | | |
| 0 | 0 | 0 | | ○ | ○ | ○ | ○ | ○ | ○ | ○ | ○ |
| 0 | 0 | 1 | | ○ | ○ | ○ | ○ | ○ | ○ | ○ | ○ |
| 0 | 1 | 1 | | ○ | ○ | ○ | ○ | ○ | ○ | ○ | ○ |
| 0 | 1 | 0 | | ○ | ○ | ○ | ○ | ○ | ○ | ○ | ○ |
| 1 | 1 | 0 | | ○ | ○ | ○ | ○ | ○ | ○ | ○ | ○ |
| 1 | 1 | 1 | | ○ | ○ | ○ | ○ | ○ | ○ | ○ | ○ |
| 1 | 0 | 1 | | ○ | ○ | ○ | ○ | ○ | ○ | ○ | ○ |
| 1 | 0 | 0 | | ○ | ○ | ○ | ○ | ○ | ○ | ○ | ○ |
| | | | | \<THIRD QUADRANT\> | | | | \<FOURTH QUADRANT\> | | | |
| | | I VALUE | LEVEL-2 | 1 | 1 | 1 | 1 | 0 | 0 | 0 | 0 |
| | | | LEVEL-1 | 0 | 0 | 1 | 1 | 1 | 1 | 0 | 0 |
| | | | LEVEL-0 | 0 | 1 | 1 | 0 | 0 | 1 | 1 | 0 |

FIG. 10

| Q VALUE | | | | | | | | | | | |
|---|---|---|---|---|---|---|---|---|---|---|---|
| LEVEL-2 | LEVEL-1 | LEVEL-0 | | \multicolumn{4}{c}{SECOND QUADRANT} | \multicolumn{4}{c}{FIRST QUADRANT} | |
| 0 | 0 | 0 | | ○ | ○ | ○ | ○ | ○ | ○ | ○ | ○ |
| 0 | 0 | 1 | | ○ | ○ | ○ | ○ | ○ | ○ | ○ | ○ |
| 0 | 1 | 0 | | ○ | ○ | ○ | ○ | ○ | ○ | ○ | ○ |
| 0 | 1 | 1 | | ○ | ○ | ○ | ○ | ○ | ○ | ○ | ○ |
| 1 | 1 | 0 | | ○ | ○ | ○ | ○ | ○ | ○ | ○ | ○ |
| 1 | 1 | 1 | | ○ | ○ | ○ | ○ | ○ | ○ | ○ | ○ |
| 1 | 0 | 0 | | ○ | ○ | ○ | ○ | ○ | ○ | ○ | ○ |
| 1 | 0 | 1 | | ○ | ○ | ○ | ○ | ○ | ○ | ○ | ○ |
| | | | | \multicolumn{4}{c}{THIRD QUADRANT} | \multicolumn{4}{c}{FOURTH QUADRANT} | |
| | | I VALUE | LEVEL-2 | 1 | 1 | 1 | 1 | 0 | 0 | 0 | 0 |
| | | | LEVEL-1 | 0 | 0 | 1 | 1 | 1 | 1 | 0 | 0 |
| | | | LEVEL-0 | 1 | 0 | 1 | 0 | 1 | 0 | 1 | 0 |

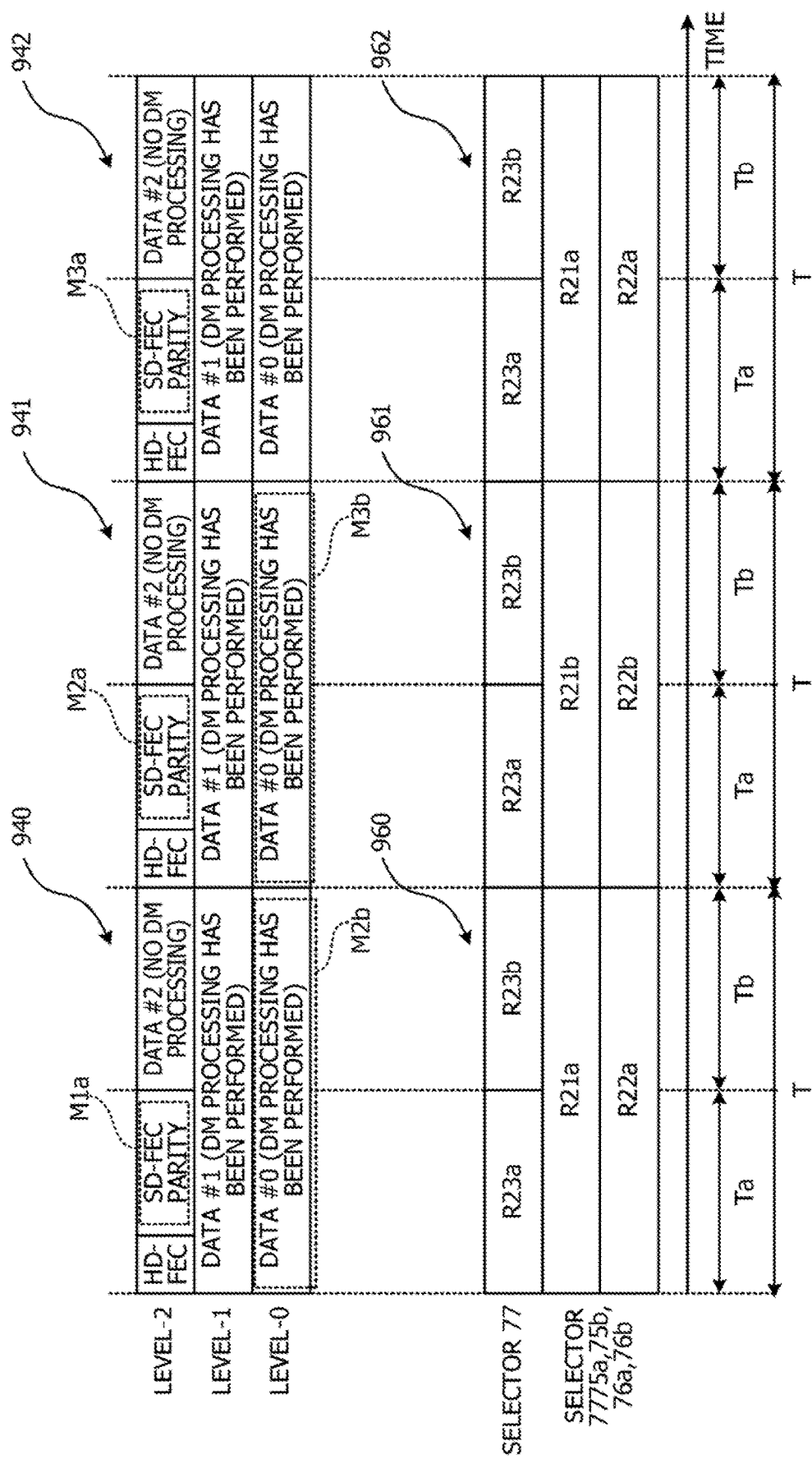

ENCODING CIRCUIT, DECODING CIRCUIT, ENCODING METHOD, AND DECODING METHOD

CROSS-REFERENCE TO RELATED APPLICATION

This application is based upon and claims the benefit of priority of the prior Japanese Patent Application No. 2019-91371, filed on May 14, 2019, the entire contents of which are incorporated herein by reference.

FIELD

The embodiments discussed herein are related to an encoding circuit, a decoding circuit, an encoding method, and a decoding method.

BACKGROUND

With the increase in the transmission capacity of the optical transmission device, for example, multi-level modulation schemes are used such as Quadrature Phase Shift Keying (QPSK), 16 Quadrature Amplitude Modulation (16QAM), and 64QAM. In the multi-level modulation scheme, among symbols arranged in a constellation, a symbol corresponding to a value of each of bit strings in a frame to be modulated is assigned to each of the bit strings, whereby an optical signal is generated having a phase and intensity corresponding to the symbol.

Probabilistic Shaping (PS) technology (hereinafter referred to as "PS") forms a probability distribution of symbol assignment by converting the value of the bit string so that a symbol closer to the center of the constellation is assigned more. The noise immunity is therefore improved of the signal light generated from the frame.

For the PS, for example, Distribution Matching (DM) processing is used for increasing the mark rate of the bit string to a rate greater than 50(%) (for example, 80(%)). The probability of symbol assignment is therefore biased toward the center of the constellation only in a specific quadrant among the first to fourth quadrants that divide the constellation. Thereafter, a quadrant in which the symbol to be assigned is located is determined from the first to fourth quadrants.

In determination of the quadrant, a parity bit of an error correction code such as Forward Error Correction (FEC) can be used. Since the mark rate of the error correction code is maintained close to 50(%), the first to fourth quadrants are selected with substantially the same probability, and a probability distribution biased toward the center of the constellation is formed over all quadrants.

Examples of the error correction code encoding method include, for example, Bit-Interleaved Coded Modulation (BICM) and Multilevel Coding (MLC). The BICM is an encoding method that collectively encodes bit strings without discrimination by level (Most Significant Bit (MSB) or Least Significant Bit (LSB)). The MLC is an encoding method that divides bit strings for respective levels and individually generates error correction codes.

For example, as related art, disclosed are: Japanese Laid-open Patent Publication No. 2008-187706; F. Buchali, et al., "Rate Adaptation and Reach Increase by Probabilistically Shaped 64-QAM: An Experimental Demonstration,", JOURNAL OF LIGHTWAVE TECHNOLOGY, VOL., 34, NO. 7, Apr. 1, 2016; U. Wachsmann, et al., "Multilevel Codes: Theoretical Concepts and Practical Design Rules", IEEE TRANSACTIONS ON INFORMATION THEORY, VOL. 45, NO. 5, July 1999; A. Bisplinghoff, et al., "Low-Power, Phase-Slip Tolerant, Multilevel Coding for M-QAM", JOURNAL OF LIGHTWAVE TECHNOLOGY, VOL., 35, NO. 4, Feb. 15, 2017; Y. Koganei, et al., "Multilevel Coding with Spatially-Coupled Codes for beyond 400 Gbps Optical Transmission", OFC, 2018, Tu3C.2, and the like.

SUMMARY

According to an aspect of the embodiments, an encoding device includes a memory, and circuitry coupled to the memory and configured to assign a symbol corresponding to a value of each of a plurality of bit strings in a frame among a plurality of the symbols in a constellation of a multi-level modulation scheme, to the plurality of bit strings, converts a value of each of the bit strings other than a first bit string among the plurality of bit strings such that a symbol closer to a center of the constellation is assigned more among the plurality of symbols, generate a first error correction code for correcting an error of the plurality of bit strings to insert the first error correction code into the first bit string, select a bit string of a generation source of the first error correction code from the plurality of bit strings, perform switching between a first period in which the first error correction code is inserted into the first bit string, and another second period, in a period of the frame, and perform control such that, in the first period, the first error correction code is generated from the bit strings other than the first bit string among the plurality of bit strings, and in the second period, the first error correction code is generated from a second bit string among the plurality of bit strings.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 is a diagram illustrating an example of symbol mapping;

FIG. 10 is a diagram illustrating another example of the symbol mapping;

FIG. 17 is a time chart illustrating a control example of selectors in the decoding circuit.

DESCRIPTION OF EMBODIMENTS

For example, in a case where 64QAM is used, in a frame using BICM, a parity bit of an error correction code generated from three bit strings is inserted only in the most significant level. Other two bit strings are subject to DM processing, and symbols are assigned corresponding to values of the two bit strings subjected to DM processing among symbols in a quadrant of a constellation determined depending on a value of the bit string of the most significant level.

At this time, as an error correction code, for example, by a soft decision code (Soft Decision (SD)-FEC) such as a turbo code or a Low-Density Parity-check Code (LDPC), encoding is performed for ail bit strings. In comparison with a hard decision code (Hard Decision (HD)-FEC) such as a BCH code or a Reed-Solomon code, the soft decision code has a higher correction capability, but has a larger power consumption in encoding and decoding.

On the other hand, in a case where an encoding target of the soft decision code is only a bit string of the least significant level by using MLC, power consumption is reduced as compared with the case of a frame using BICM.

However, in an ordinary MLC method, since a parity bit of an error correction code that cannot be subjected to DM processing is inserted into the bit string of the least significant level, there is a possibility that an effect is reduced of noise immunity improvement by PS as compared to the case of the frame using BICM.

Thus, an object of the present embodiment is to provide an encoding circuit, a decoding circuit, an encoding method, and a decoding method enabled to reduce power consumption without reducing noise immunity.

Figure 1:
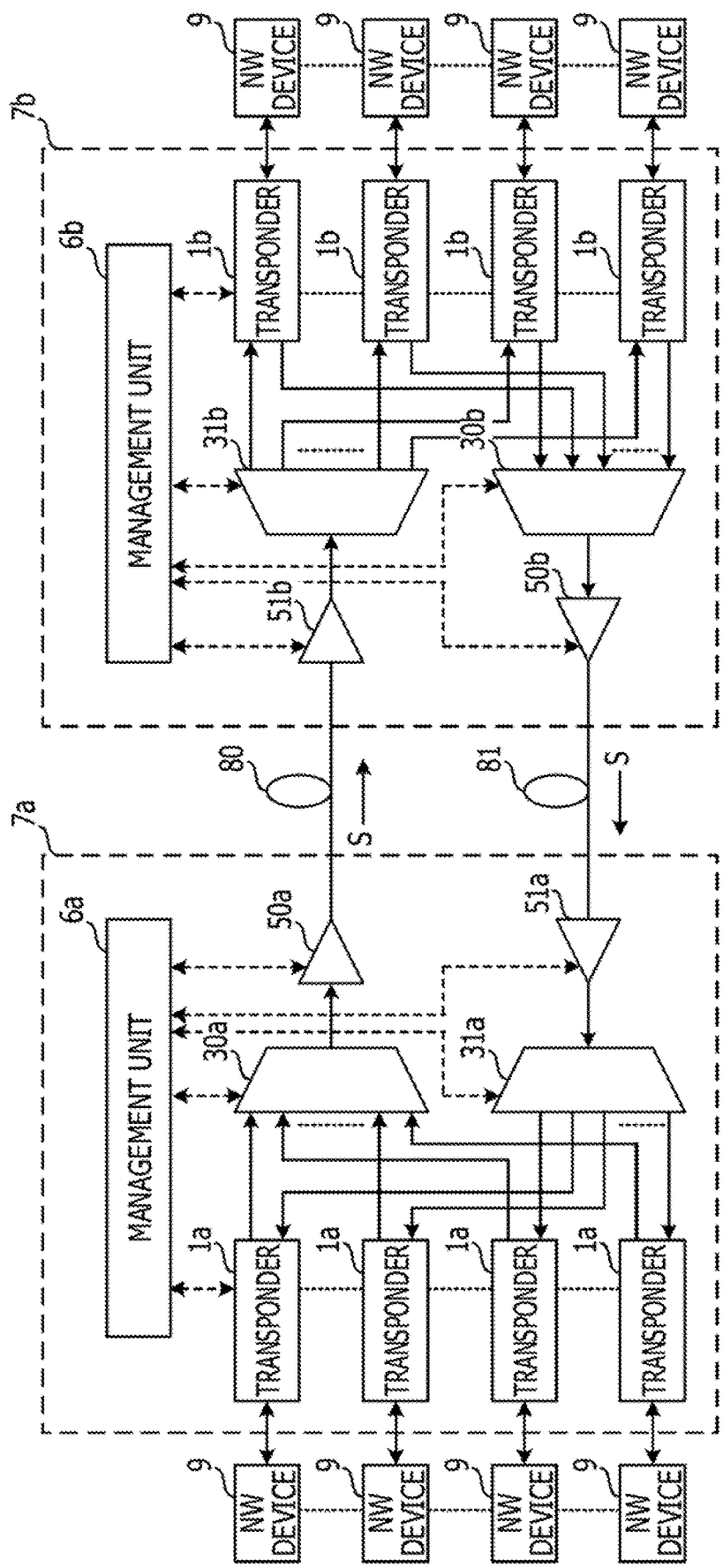
FIG. 1 is a configuration diagram illustrating an example of an optical transmission system.

As one aspect, it is enabled to reduce power consumption without reducing noise immunity, FIG. 1 is a configuration diagram illustrating an example of an optical transmission system. The optical transmission system includes a set of wavelength multiplexing optical transmission devices 7a and 7b connected to each other via transmission lines 80 and 81 such as optical fibers. The wavelength multiplexing optical transmission devices 7a and 7b mutually transmit and receive wavelength multiplexed optical signals S in which a plurality of optical signals having respective different wavelengths are subjected to wavelength multiplexing.

The wavelength multiplexing optical transmission device 7a includes a plurality of transponders 1a, an optical multiplexing unit 30a, an optical demultiplexing unit 31a, optical amplifiers 50a and 51a, and a management unit 6a. Furthermore, the wavelength multiplexing optical transmission device 7b includes a plurality of transponders 1b, an optical multiplexing unit 30b, an optical demultiplexing unit 31b, optical amplifiers 50b and 51b, and a management unit 6b.

The transponders 1a and 1b transmit and receive optical signals. The optical signal has, for example, an OTUCn frame format defined in ITU-T Recommendation G.709.

The transponders 1a and 1b are connected to a network (NW) device 9 such as a router on the client network side. The transponders 1a and 1b transmit and receive a plurality of client signals to and from network devices 9. The transponders 1a and 1b store the plurality of client signals from the network devices 9 in a common frame and output the signals to the optical multiplexing units 30a and 30b, and extract the plurality of client signals from the frame from the optical multiplexing units 30a and 30b to transmit the signals to the network devices 9.

The optical multiplexing units 30a and 30b are, for example, optical selection switches and optical filters, and perform wavelength multiplexing of optical signals input from the plurality of transponders 1a and 1b onto the wavelength multiplexed optical signals S to output the resulting signals to the optical amplifiers 50a and 50b. The optical amplifiers 50a and 50b amplify the wavelength multiplexed optical signals S and output the amplified signal to the transmission lines 80 and 81.

The wavelength multiplexed optical signals S are input from the transmission lines 81 and 80 to the optical amplifiers 51a and Sib. The optical amplifiers 51a and 51b amplify the wavelength multiplexed optical signals S and output the amplified signal to the optical demultiplexing units 31a and 31b.

The optical demultiplexing units 31a and 31b are, for example, optical selection switches and optical filters, and separate the wavelength multiplexed optical signals S into optical signals of respective wavelengths. The optical signals are input from the optical demultiplexing units 31a and 31b to the transponders 1a and 1b.

The management units 6a and 6b are circuits including a processor such as a central processing unit (CPU), for example, and control the wavelength multiplexing optical transmission devices 7a and 7b. The management units 6a and 6b, for example, set gains for the optical amplifiers 50a and 50b, and set wavelength multiplexing target frames for the optical multiplexing units 30a and 30b. Furthermore, the management units 6a and 6b, for example, set separation target optical signals for the optical demultiplexing units 31a and 31b, and perform settings related to storing of the client signals in the frames for the transponders 1a and 1b.

Figure 2:
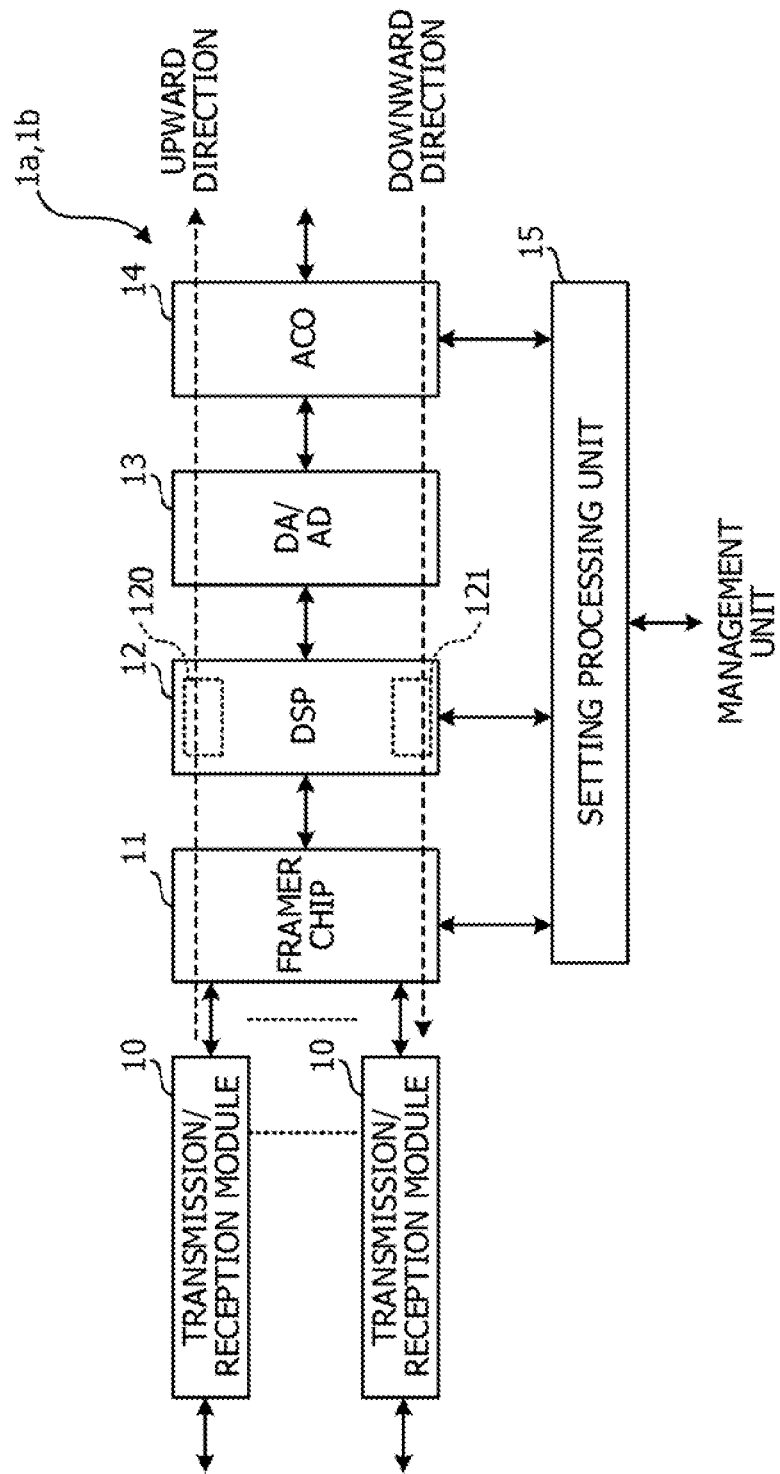
FIG. 2 is a configuration diagram illustrating an example of a transponder.

FIG. 2 is a configuration diagram illustrating an example of the transponders 1a and 1b. The transponders 1a and 1b include a plurality of transmission/reception modules 10, a framer chip 11, a digital signal processor (DSP) 12, an analog-digital conversion unit (DA/AD) 13, an analog coherent optics (ACO) 14, and a setting processing unit 15.

The transmission/reception modules 10 are optical modules detachable from a circuit board on which the framer chip 11 is mounted via an electrical connector, for example. The transmission/reception modules 10 transmit and receive client signals to and from the network devices 9. Examples of the frame format of the client signals include a Synchronous optical network (SONET) frame and a GigabitEthernet (registered trademark) (GbE) frame, but are not limited to this.

First, description will be given of processing in the upward direction toward the ACO 14 from the transmission/reception modules 10.

The transmission/reception modules 10 perform light-electricity conversion on client signals received from the network devices 9, and output converted signals to the framer chip 11. The framer chip 11 stores the client signals input from the respective transmission/reception modules 10 in a frame. In the present embodiment, an example of the frame is an OTUCn frame, but is not limited to this, and another frame may be used.

The framer chip 11 outputs the frame to the DSP 12. The DSP 12 generates an error correction code for the frame, modulates the frame with a multi-level modulation scheme, and outputs the modulated frame to the analog-digital conversion unit 13. The analog-digital conversion unit 13 converts the frame from a digital signal to an analog signal and outputs the converted frame to the ACO 14. The ACO 14 converts the frame from an electric signal to an optical signal and outputs the optical signal to the optical multiplexing units 30*a* and 30*b*.

Next, description will be given of processing in the downward direction toward the transmission/reception modules 10 from the ACO 14.

The ACO 14 receives an optical signal, converts the optical signal into an electric signal, and outputs the electric signal to the analog-digital conversion unit 13. The analog-digital conversion unit 13 converts the electric signal from an analog signal to a digital signal, and output the digital signal to the DSP12. The DSP 12 performs demodulation processing on the electric signal to reproduce the frame, and performs error correction, and then outputs the frame to the framer chip 11.

The framer chip 11 extracts client signals from the frame and outputs the client signals to the transmission/reception modules 10. The transmission/reception modules 10 convert the client signals from electric signals to optical signals and transmit the optical signals to the network devices 9.

Furthermore, the setting processing unit 15 performs various settings for the framer chip 11, the DSP 12, and the ACO 14 in accordance with instructions of the management units 6*a* and 6*b*.

Furthermore, the DSP 12 includes an encoding circuit 120 for encoding a plurality of bit strings in an upward direction frame, and a decoding circuit 121 for decoding a plurality of bit strings in a downward direction frame. Each of the bit strings is a series of bit values obtained by performing parallel conversion on serial data of the frame.

(Encoding and Decoding by BICM)

Figure 3:
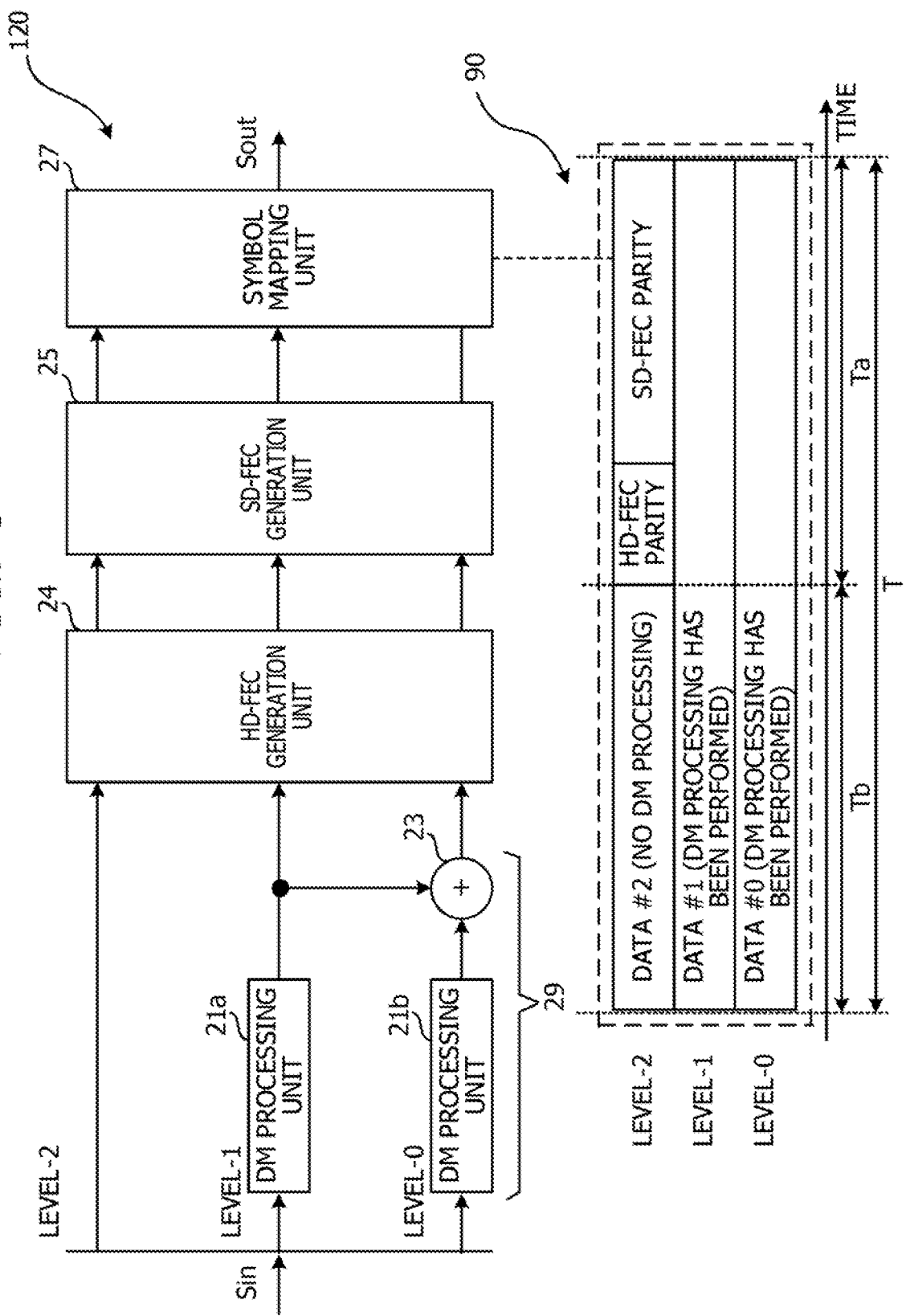
FIG. 3 is a configuration diagram illustrating an example of an encoding circuit using BICM.

FIG. 3 is a configuration diagram illustrating an example of the encoding circuit 120 using BICM. The encoding circuit 120 includes a PS conversion unit 29, an HD-FEC generation unit 24, an SD-FEC generation unit 25, and a symbol mapping unit 27. The PS conversion unit 29 includes DM processing units 21*a* and 21*b* and an exclusive OR (XOR) operator 23. Note that, in the present embodiment, 64QAM is given as an example of the multi-level modulation scheme, but the multi-level modulation scheme is not limited to this.

A frame signal Sin input from the framer chip 11 is divided into three bit strings of level-0 to level-2 Here, the bit string of level-2 is the MSB, and level-0 is the LSB. Each of the bit strings of level-0 to level-2 is transmitted onto an individual lane.

The PS conversion unit 29 forms a probability distribution of symbol assignment for each of the bit strings of level-0 to level-2 by PS. The DM processing unit 21*a* performs DM processing on the bit string of level-1 and the DM processing unit 21*b* performs DM processing on the bit string of level-0. The mark rate of each of the bit strings of level-0 and level-1 therefore increases to a rate greater than 50(%) (for example, 80(%)), and the number of values of "1" becomes greater than that of "0" in each of the bit strings of level-0 and level-1.

The XOR operator 23 XORs the value of the bit string of level-0 with the value of the bit string of level-1. The value of the bit string of level-0 therefore becomes a value obtained by XORing the original value of the bit string of level-0 with the value of the bit string of level-1. Each of the bit strings is output from the PS conversion unit 29 to the HD-FEC generation unit 24.

The HD-FEC generation unit 24 generates an HD-FEC parity that is a hard decision code, from the bit strings of level-0 to level-2. The HD-FEC generation unit 24 inserts the HD-FEC parity into the bit string of level-2, Each of the bit strings is output from the HD-FEC generation unit 24 to the SD-FEC generation unit 25. Note that, the HD-FEC parity is an example of a second error correction code.

The SD-FEC generation unit 25 generates an SD-FEC parity that is a soft decision code, from the bit strings of level-0 to level-2. The SD-FEC generation unit 25 inserts the SD-FEC parity into the bit string of level-2. Each of the bit strings is output from the SD-FEC generation unit 25 to the symbol mapping unit 27.

The symbol mapping unit 27 assigns symbols corresponding to values of the bit strings of level-0 to level-2 among a plurality of symbols in a constellation of 64QAM, to the bit strings. The symbol mapping unit 27 outputs an output signal Sout corresponding to the assigned symbol to the analog-digital conversion unit 13.

A reference numeral 90 indicates contents of the bit strings in the frame input to the symbol mapping unit 27. The bit strings of level-0 and level-1 include data #0 and #1 on which DM processing has been performed, respectively.

Furthermore, the bit string of level-2 includes data #2 that has not been subjected to DM processing, the HD-FEC parity, and the SD-FEC parity. The HD-FEC parity and the SD-FEC parity are inserted into a period Ta within a period T of the frame, and the data #2 is inserted into a period 1*b* within the period T of the frame. The periods Ta and Tb are set so that the HD-FEC parity and the SD-FEC parity are, for example, about 20(%) of the amount of data of the entire frame.

Figure 4:
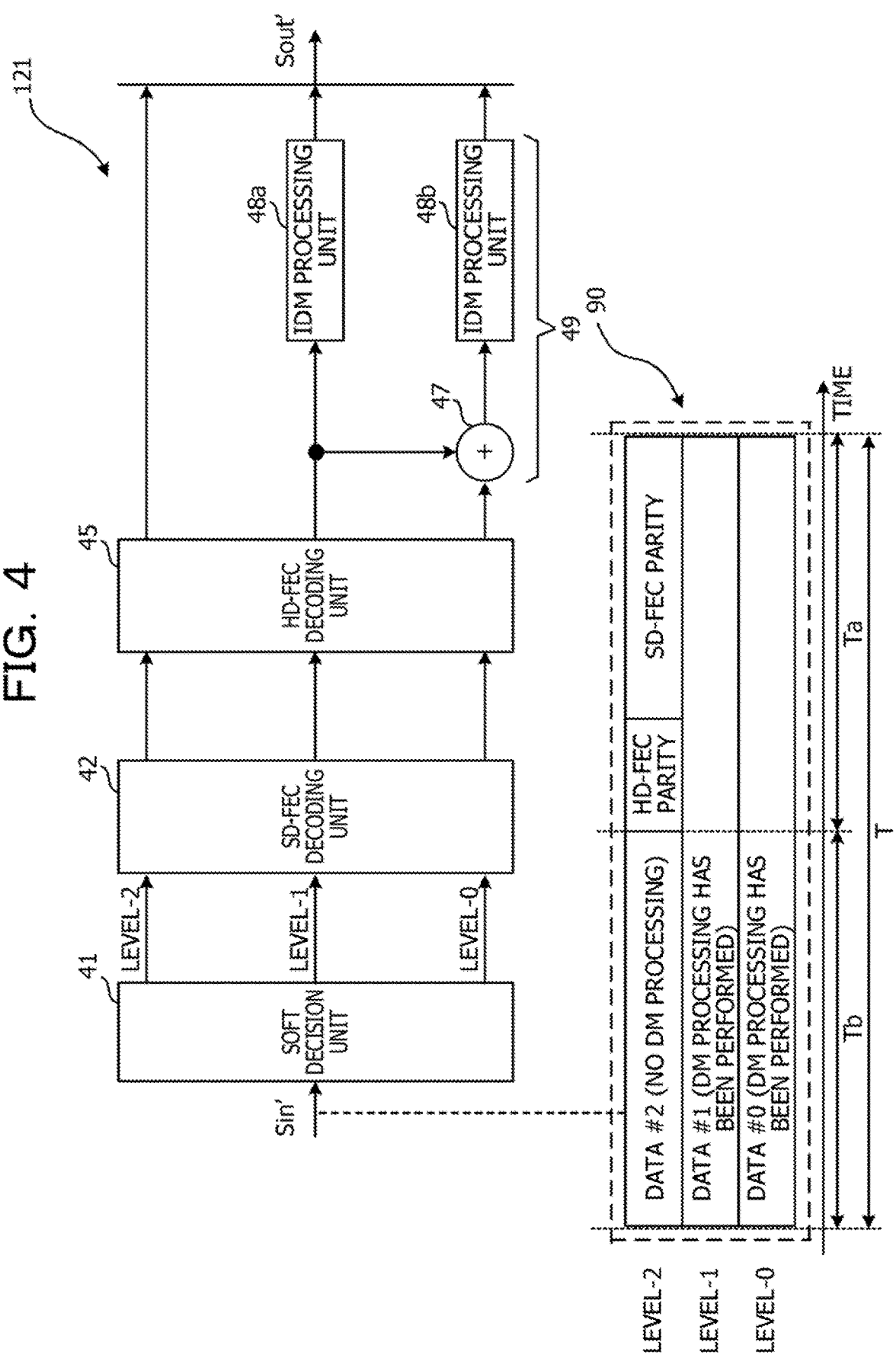
FIG. 4 is a configuration diagram illustrating an example of a decoding circuit using BICM.

FIG. 4 is a configuration diagram illustrating an example of the decoding circuit 121 using BICM. The decoding circuit 121 includes a soft decision unit 41, an SD-FEC decoding unit 42, an HD-FEC decoding unit 45, and a PS inverse conversion unit 49. The PS inverse conversion unit 49 includes an XOR operator 47 and Inverse-DM (IDM) processing units 48*a* and 48*b*.

The soft decision unit 41 performs restoration by performing soft decision on a value of each of the bit strings of level-0 to level-2 from the input signal Sin' input from the analog-digital conversion unit 13. The soft decision unit 41 determines probability of values "0" and "1" of the bit strings from symbols indicated by the input signal Sin'. Each of the bit strings of level-0 to level-2 is transmitted to an individual lane. The soft decision unit 41 outputs the value of each of the bit strings of level-0 to level-2 to the SD-FEC decoding unit 42.

The SD-FEC decoding unit 42 corrects the values of the bit strings of level-0 to level-2 on the basis of the SD-FEC parity. For example, the SD-FEC decoding unit 42 performs decoding by using the SD-FEC parity. The SD-FEC decoding unit 42 outputs each of the bit strings of level-0 to level-2 to the HD-FEC decoding unit 45.

The HD-FEC decoding unit 45 corrects the value of each of the bit strings of level-0 to level-2 on the basis of the HD-FEC parity. For example, the HD-FEC decoding unit 45 performs decoding by using the HD-FEC parity. The HD- FEC decoding unit 45 outputs each of the bit strings of level-0 to level-2 to the PS inverse conversion unit 49.

The PS inverse conversion unit 49 performs conversion reverse to the conversion by the PS conversion unit 29 for each of the bit strings of level-0 to level-2, The XOR operator 47 XORs the value of the bit string of level-0 with the value of the bit string of level-1. The value of the bit string of level-0 therefore becomes the original value of the bit string of level-0 before being XORed by the XOR operator 23 of the encoding circuit 120.

The bit string of level-1 is input to the IDM processing unit 48a, and the bit string of level-0 is input from the XOR operator 47 to the IDM processing unit 48b.

The IDM processing units 48a and 48b perform Inverse-DM processing that is inverse conversion processing of DM processing of the DM processing units 21a and 21b on the bit strings of level-1 and level-0, respectively. The bit strings of level-0 and level-1 therefore become values before being converted by the DM processing units 21a and 21b of the PS conversion unit 29 in the encoding circuit 120. The bit strings of level-0 to level-2 are output to the framer chip 11 as an output signal Sout'.

The PS conversion unit 29 of the encoding circuit 120 converts the value of each of the bit strings of level-0 and level-1 so that a symbol closer to the center of the constellation of 64QAM is assigned more. A probability distribution is therefore formed in which a symbol closer to the center of the constellation has a higher probability of symbol assignment.

Figure 5:
FIG. 5 is a diagram illustrating an example of processing of PS.

FIG. 5 is a diagram illustrating an example of processing of PS. In the present embodiment, a constellation of 16QAM is given as an example for convenience of explanation. In the constellation, symbols P11 to P14, P21 to P24, P31 to P34, and P41 to P44, which are signal points, are equally divided and arranged in first to fourth quadrants.

The size of a circle indicating each of the symbols P11 to P14, P21 to P24, P31 to P34, and P41 to P44 indicates a value of the probability of symbol assignment. The probabilities of symbol assignment before PS are equal to each other among the symbols P11 to P14, P21 to P24, P31 to P34, and P41 to P44.

The symbols P11 to P14, P21 to P24, P31 to P34, and P41 to P44 closer to the center point O have higher probabilities of symbol assignment after PS. For example, the symbols P22, P23, P32, and P33 having the shortest distance from the center point O have the maximum probability of symbol assignment, and the symbols P11, P14, P41, and P44 having the longest distance from the center point O have the minimum probability of symbol assignment.

In the formation of the probability distribution of symbol assignment, the value of each of the bit strings of level-0 and level-1 is converted so that the symbols P22, P23, P32, and P33 closer to the center point O have higher probabilities of symbol assignment, and quadrants of the symbols P11 to P14, P21 to P24, P31 to P34, and P41 to P44 are determined by the value of the bit string of level-2.

FIG. 6 is a diagram illustrating an example of symbol mapping. The symbol mapping unit 27 maps each of the bit strings of level-0 to level-2 to a symbol by Gray code mapping.

The symbol mapping unit 27 assigns the value of each of the bit strings of level-0 to level-2 to an I value and a Q value. For example, the symbol mapping unit 27 may assign the same value of each of the bit strings of level-0 to level-2 to both the I value and the Q value. For example, in a case where the value of the bit string of level-0 is "1", the I value and the Q value are each "1".

Furthermore, the symbol mapping unit 27 may alternately assign the value of each of the bit strings of level-0 to level-2 to the I value and the Q value. For example, in a case where the values of two consecutive bits in the bit string of level-0 are "1" and "0", the I value is "1" and the Q value is "1".

The I value and Q value of the bit string of level-2 determine a quadrant of a symbol to be assigned. In a case where the I value="0" and the Q value="0", a symbol in the first quadrant is assigned, and in a case where the I value="1" and the Q value="0", a symbol in the second quadrant is assigned. Furthermore, in a case where the I value="1" and the Q value="1", a symbol in the third quadrant is assigned, and in a case where the I value="0" and the Q value="0", a symbol in the fourth quadrant is assigned.

The PS conversion unit 29 XORs the value of the bit string of level-1 with the value of the bit string of level-0 by the XOR operator 23 so that a symbol closer to the center point O has a higher symbol assignment probability.

Figure 7:
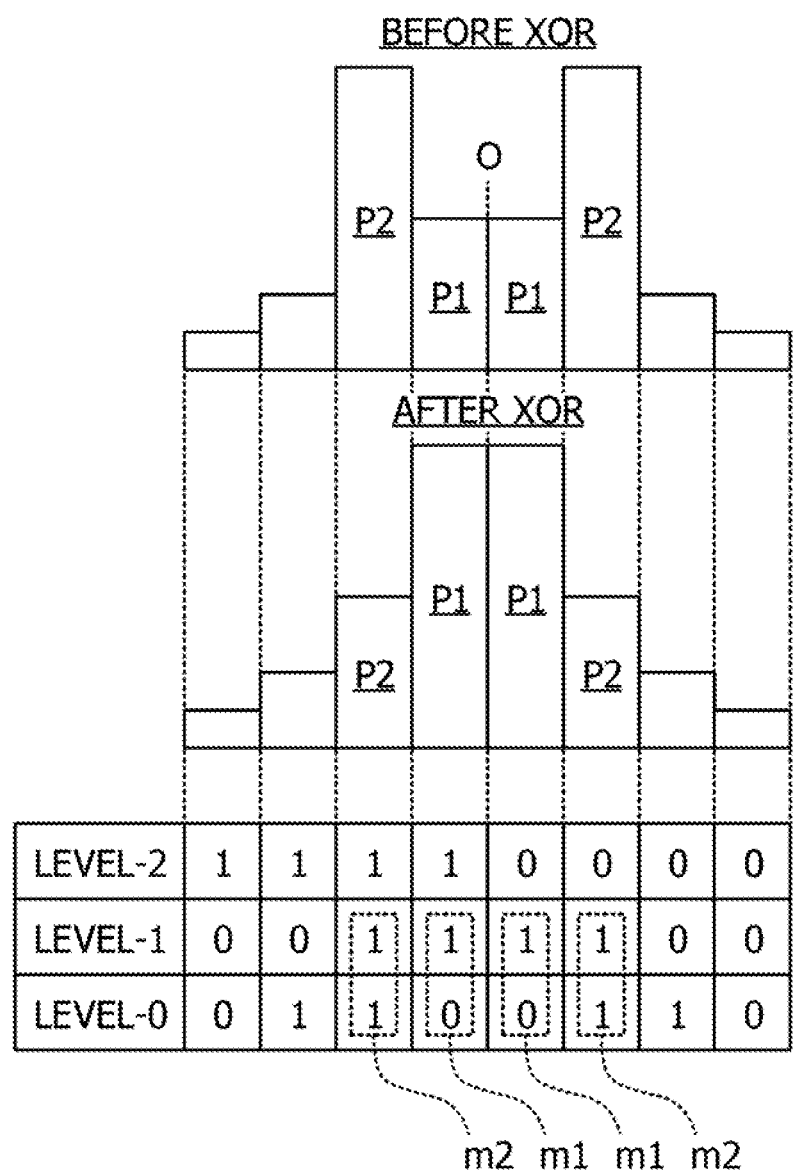
FIG. 7 is a diagram illustrating an example of a probability distribution of symbol assignment before and after XOR.

FIG. 7 is a diagram illustrating an example of the probability distribution of symbol assignment before and after XOR. Note that, the values of the bit strings of level-0 to level-2 in FIG. 7 may be any of the I value and the Q value.

The DM processing units 21a and 21b respectively convert the values of the bit strings of level-1 and level-0 so that the number of values of "1." becomes greater than that of "0", For this reason, a probability increases that the values of the bit strings of level-0 and level-1 are both "1" (see reference sign m2), and a symbol P1 closest to the center point O has a lower probability than that of a symbol P2 outside the symbol P1 in the probability distribution of symbol assignment before XOR.

However, in the arrangement of the Gray code, a probability increases that the value of the bit string of level-0 becomes "0" by being XORed with the value of the bit string of level-1. For this reason, a probability increases that the values of the bit strings of level-0 and level-1 becomes "0" and "1", respectively (see reference sign m1), and the symbol P1 closest to the center point O has a higher probability than that of the symbol P2 outside the symbol P1 in the probability distribution of symbol assignment after XOR.

Furthermore, the value of the bit string of level-2 is the HD-FEC parity and the SD-FEC parity generated respectively by the HD-FEC generation unit 24 and the SD-FEC generation unit 25. Since the mark rates of the HD-FEC parity and the SD-FEC parity are maintained close to 50(%), the first to fourth quadrants are selected with substantially the same probability, and a probability distribution is formed biased toward the center point O of the constellation over all quadrants. For this reason, the noise immunity of the output signal is increased.

However, as illustrated in FIG. 3, the SD-FEC generation unit 25 sets a whole of the bit strings of level-0 to level-2 (see a dotted frame) as an encoding target area. For example, the SD-FEC generation unit 25 generates an SD-FEC parity from the bit strings of level-0 to level-2. The soft decision code has higher correction capability than the hard decision code, but has a larger power consumption in encoding and decoding.

(Encoding and Decoding by MLC)

Figure 8:
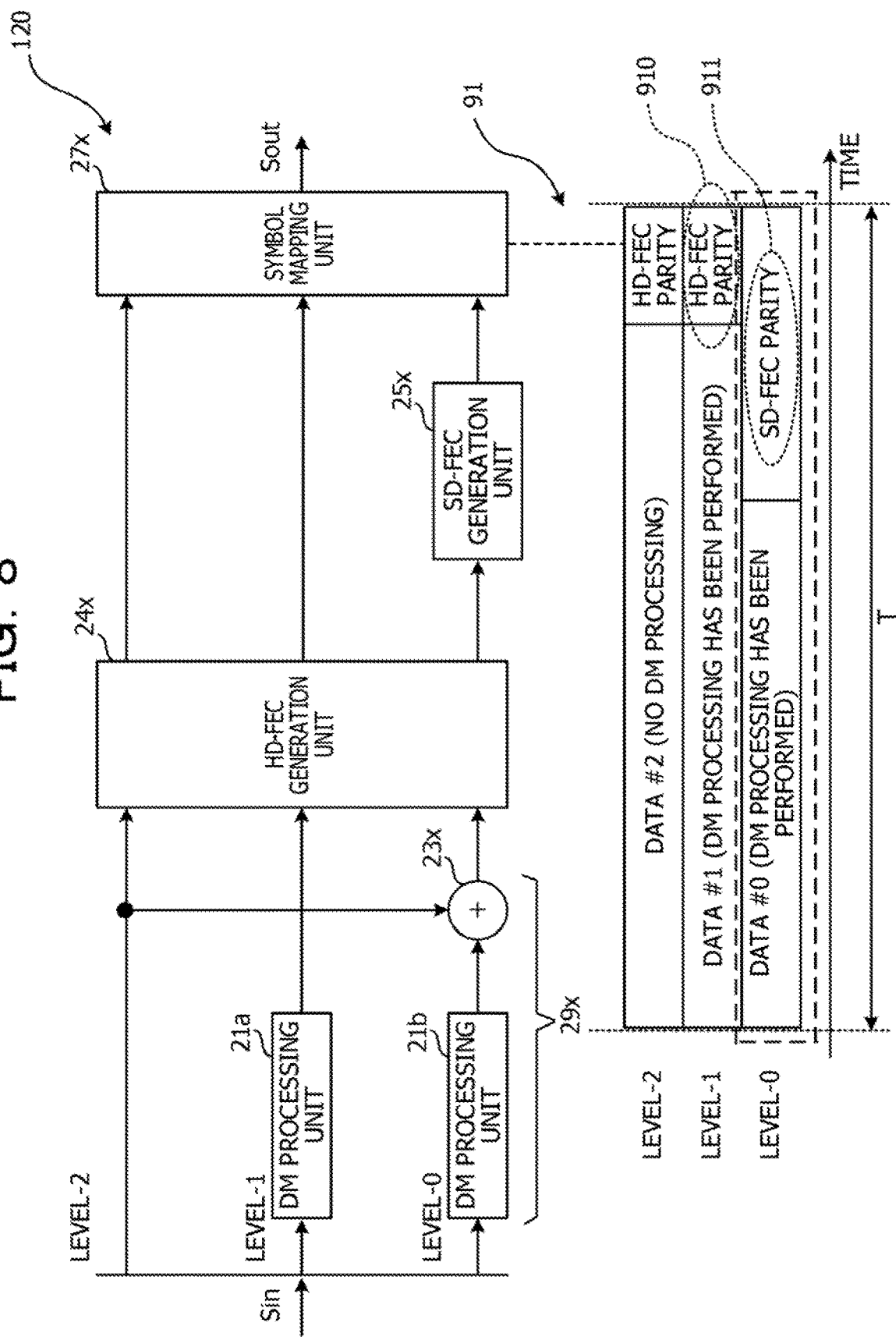
FIG. 8 is a configuration diagram illustrating an example of an encoding circuit using MLC.

FIG. 8 is a configuration diagram illustrating an example of the encoding circuit 120 using MLC. In FIG. 8, the same components as those in FIG. 3 are denoted by the same reference signs, and description thereof will be omitted.

The encoding circuit 120 includes a PS conversion unit 29x, an HD-FEC generation unit 24x, an SD-FEC generation unit 25x, and a symbol mapping unit 27x, The PS conversion unit 29x includes the DM processing units 21a and 21b and an XOR operator 23x. Note that, in the present embodiment, 64QAM is given as an example of the multi-level modulation scheme, but the multi-level modulation scheme is not limited to this.

The PS conversion unit 29x converts the value of each of the bit strings of level-0 and level-1 so that a symbol closer to the center of the constellation of 64QAM is assigned more. The XOR operator 23x XORs the value of the bit string of level-0 with the value of the bit string of level-2. The value of the bit string of level-0 therefore becomes a value obtained by XORing the original value of the bit string of level-0 with the value of the bit string of level-2. Each of the bit strings is output from the PS conversion unit 29x to the HD-FEC generation unit 24x.

The HD-FEC generation unit 24x individually generates an HD-FEC parity that is a hard decision code, from the bit strings of level-0 to level-2. The HD-FEC generation unit 24x inserts the HD-FEC parity of the bit string of level-1 into the bit string of level-1, and inserts the HD-FEC parity of the bit string of level-2 into the bit string of level-2. Each of the bit strings of level-1 and level-2 is output from the HD-FEC generation unit 24x to the symbol mapping unit 27x.

Furthermore, the HD-FEC generation unit 24x inserts the HD-FEC parity of the bit string of level-0 into the bit string of level-0. The bit string of level-0 is output from the HD-FEC generation unit 24x to the SD-FEC generation unit 25x.

The SD-FEC generation unit 25x generates an SD-FEC parity that is a soft decision code, from the bit string of level-0. The SD-FEC generation unit 25x deletes the HD-FEC parity from the bit string of level-0, and inserts the SD-FEC parity into the bit string of level-0. The bit string of level-0 is output from the SD-FEC generation unit 25x to the symbol mapping unit 27x.

The symbol mapping unit 27x assigns symbols corresponding to values of the bit strings of level-0 to level-2 among the plurality of symbols in the constellation of 64QAM, to the bit strings. The symbol mapping unit 27x outputs the output signal Sout corresponding to the assigned symbol to the analog-digital conversion unit 13.

A reference numeral 91 indicates contents of the bit strings in the frame input to the symbol mapping unit 27x. The bit string of level-0 includes data #0 on which DM processing has been performed, and the SD-FEC parity. The bit string of level-1 includes data #1 on which DM processing has been performed, and the HD-FEC parity, and the bit string of level-2 includes data #2 on which DM processing has been performed, and the HD-FEC parity.

Figure 9:
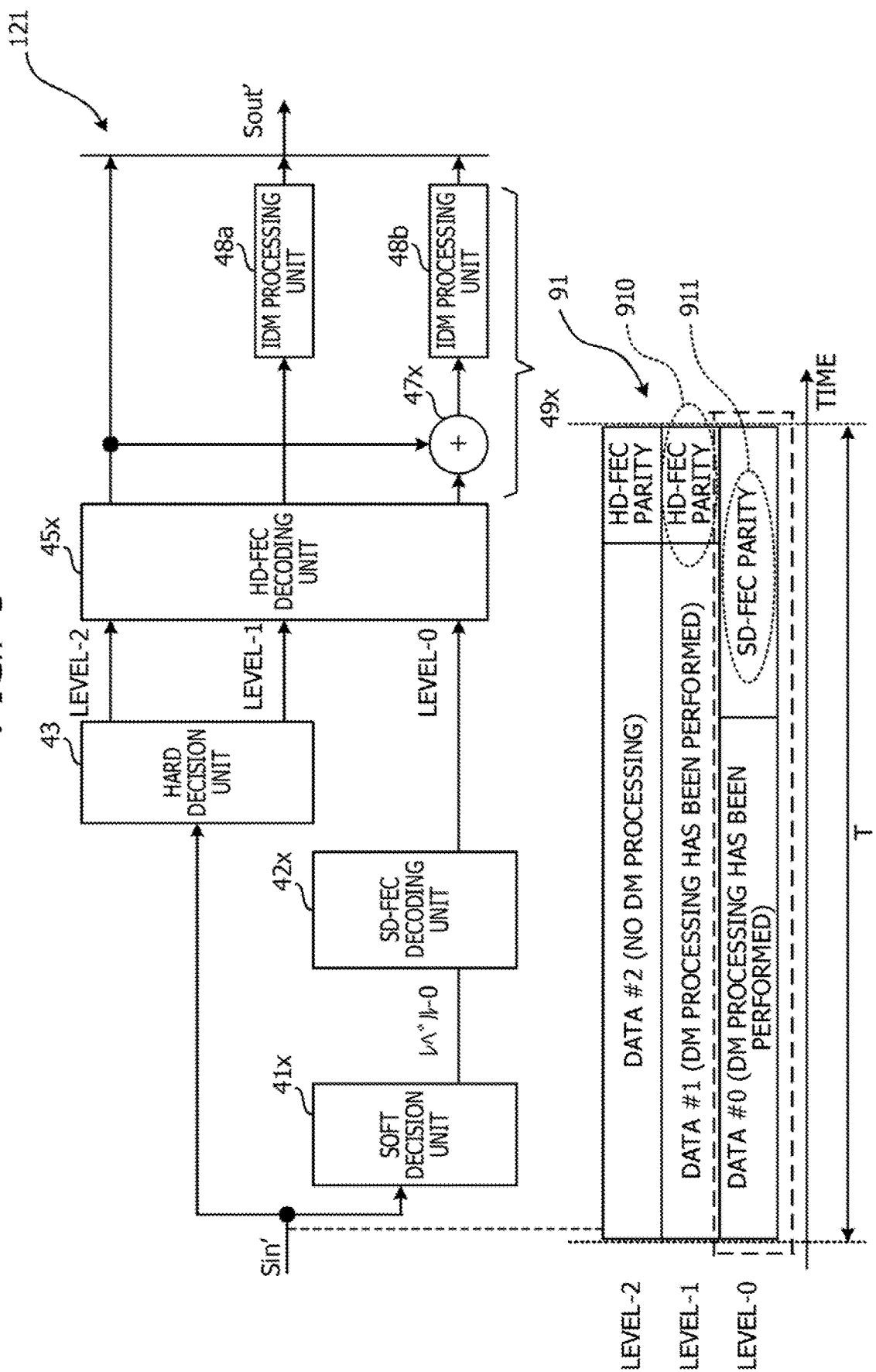
FIG. 9 is a configuration diagram illustrating an example of a decoding circuit using MLC.

FIG. 9 is a configuration diagram illustrating an example of the decoding circuit 121 using MLC. In FIG. 9, the same components as those in FIG. 4 are denoted by the same reference signs, and description thereof will be omitted.

The decoding circuit 121 includes a soft decision unit 41x, an SD-FEC decoding unit 42x, an HD-FEC decoding unit 45x, and a PS inverse conversion unit 49x. The PS inverse conversion unit 49x includes an XOR operator 47x and IDM processing units 48a and 48b. The input signal Sin' is input to each of the soft decision unit 41x and the hard decision unit 43.

The soft decision unit 41x performs restoration by performing soft decision on a value of the bit string of level-0 from the input signal Sin'. The soft decision unit 41x determines probability of values "0" and "1" of the bit strings from symbols indicated by the input signal Sin'. The soft decision unit 41x outputs the value of the bit string of level-0 to the SD-FEC decoding unit 42x.

The SD-FEC decoding unit 42x corrects the value of the bit string of level-0 on the basis of the SD-FEC parity. For example, the SD-FEC decoding unit 42x performs decoding by using the SD-FEC parity. The SD-FEC decoding unit 42x outputs the bit string of level-0 to the HD-FEC decoding unit 45x.

Furthermore, the hard decision unit 43 performs restoration by performing hard decision on the values of the bit strings of level-1 and level-2 from the input signal Sin'. The hard decision unit 43 determines values "0" and "1" of the bit strings from symbols indicated by the input signal Sin'. The hard decision unit 43 outputs the value of each of the bit strings of level-1 and level-2 to the HD-FEC decoding unit 45x.

The HD-FEC decoding unit 45x corrects the value of each of the bit strings of level-0 to level-2 on the basis of the HD-FEC parity. For example, the HD-FEC decoding unit 45x performs decoding by using the HD-FEC parity. The HD-FEC decoding unit 45x outputs each of the bit strings of level-0 to level-2 to the PS inverse conversion unit 49x.

The PS inverse conversion unit 49x is an example of an inverse conversion unit, and performs conversion reverse to the conversion by the PS conversion unit 29x for each of the bit strings of level-0 to level-2. The XOR operator 47x XORs the value of the bit string of level-0 with the value of the bit string of level-2. The value of the bit string of level-0 therefore becomes the original value of the bit string of level-0 before being XORed by the XOR operator 23x of the encoding circuit 120.

The bit string of level-1 is input to the IDM processing unit 48a, and the bit string of level-0 is input from the XOR operator 47x to the IDM processing unit 48b. The bit strings of level-0 to level-2 are output to the framer chip 11 as an output signal Sout'.

The PS conversion unit 29x of the encoding circuit 120 converts the value of each of the bit strings of level-0 and level-1 so that a symbol closer to the center of the constellation of 64QAM is assigned more. A probability distribution is therefore formed in which a symbol closer to the center of the constellation has a higher probability of symbol assignment.

Furthermore, the symbol mapping unit 27x performs symbol mapping different from the symbol mapping by the symbol mapping unit 27 of BICM.

FIG. 10 is a diagram illustrating another example of the symbol mapping. In FIG. 10, description of contents common to FIG. 6 will be omitted.

The symbol mapping unit 27x maps each of the bit strings of level-0 to level-2 to a symbol by Set-partitioning. The arrangement of the values of the bit strings of level-0 and level-1 in the Set-partitioning is different from the arrangement in the Gray code.

According to this arrangement, the HD-FEC decoding unit 45x of the decoding circuit 121 performs multi-stage decoding (MSD), whereby the Euclidean distance between the symbols in the constellation can be made longer than that in the case of the Gray code. For example, in a case where the bit string of level-0 that is the LSB is correctly decoded with the I value=1 and the Q value=0, only solid line circle symbols in the constellation can be limited as decoding target symbols.

For this reason, even though the SD-FEC is applied only to the bit string of level-0, it is possible to reduce errors in the bit strings of the level-1 and level-2 of higher levels, and suppress a decrease in error correction capability.

Furthermore, the PS conversion unit 29x XORs the value of the bit string of level-2 with the value of the bit string of level-0 by the XOR operator 23x so that a symbol closer to the center point O has a higher symbol assignment probability.

Figure 11:
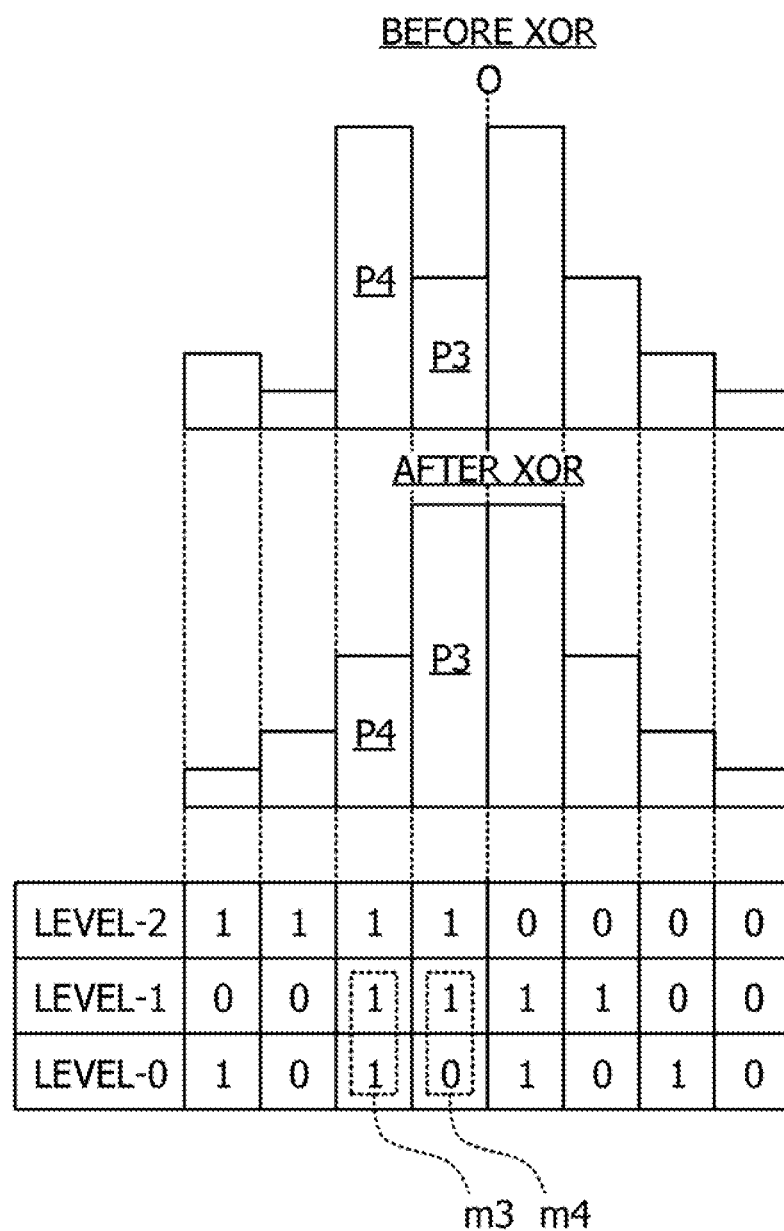
FIG. 11 is a diagram illustrating an example of a probability distribution of symbol assignment before and after XOR.

FIG. 11 is a diagram illustrating an example of the probability distribution of symbol assignment before and after XOR. Note that, in FIG. 11, description of contents common to FIG. 7 will be omitted.

Since the DM processing units 21a and 21b respectively convert the values of the bit strings of level-1 and level-0 so that the number of values of "1" becomes greater than that of "0", the probability increases that the values of the bit strings of level-0 and level-1 are both "1" (see reference sign m3). Here, in the Set-partitioning, the arrangement of the I value and the Q value of the bit string of level-0 is asymmetric with respect to the center point O. For this reason, on one side with respect to the center point O, a symbol P3 closest to the center point O has a lower probability than that of a symbol P4 outside the symbol P3 in the probability distribution of symbol assignment before XOR.

However, in the arrangement of the Set-partitioning, a probability increases that the value of the bit string of level-0 becomes "0" by being XORed with the value of the bit string of level-2 symmetrical with respect to the center point O. For this reason, a probability increases that the values of the bit strings of level-0 and level-1 becomes "0" and "1", respectively (see reference sign m4), and the symbol P3 closest to the center point O has a higher probability than that of the symbol P4 outside the symbol P3 in the probability distribution of symbol assignment after XOR.

Furthermore, the value of the bit string of level-2 is the HD-FEC parity generated by the HD-FEC generation unit 24x. Since the mark rate of the HD-FEC parity is maintained close to 50(%), the first to fourth quadrants are selected with substantially the same probability.

As illustrated in FIGS. 8 and 9, in the frame using MLC, since the SD-FEC parity is generated only from the bit string of level-0 power consumption is reduced as compared with the case where BICM is used.

However, in a case where MLC is used, since the SD-FEC parity (see reference numeral 911) that cannot be subjected to DM processing is inserted into the bit string of level-0, there is a possibility that the effect is reduced of noise immunity improvement by PS as compared to the case where BICM is used. Furthermore, since the HD-FEC parity (see reference numeral 910) that is not subjected to DM processing is inserted into the bit string of level-1, there also is a possibility that the effect is reduced of noise immunity improvement by PS as compared to the case where BICM is used.

First Embodiment

Thus, as described below, the encoding circuit 120 of a first embodiment divides the period T of the frame used for BICM into two periods Ta and Tb, and uses BICM in the period Ta including the SD-FEC parity and the HD-FEC parity, and uses MLC in the other period Tb.

Figure 12:
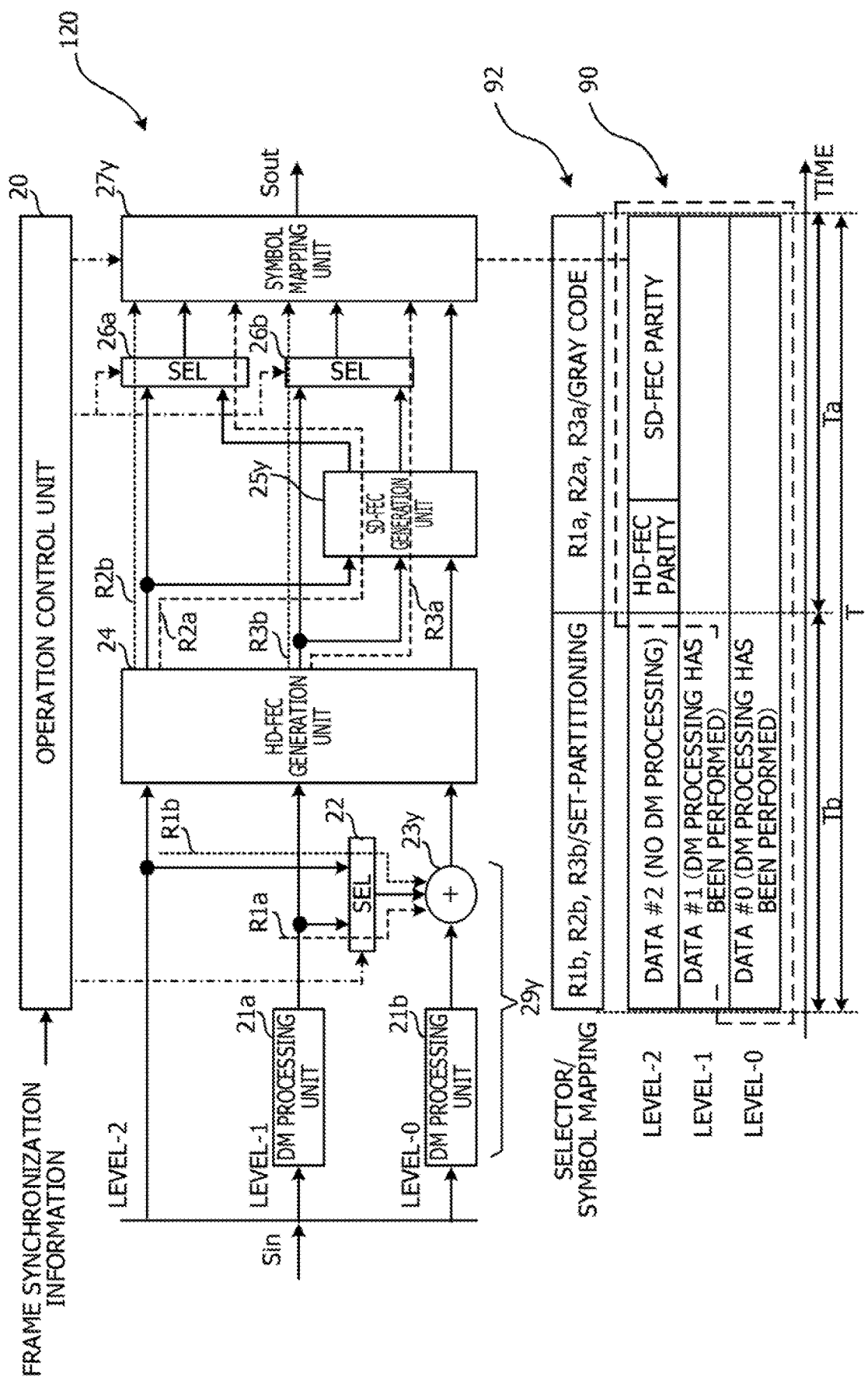
FIG. 12 is a configuration diagram illustrating an encoding circuit of a first embodiment.

FIG. 12 is a configuration diagram illustrating the encoding circuit 120 of the first embodiment. In FIG. 12, the same components as those in FIG. 3 are denoted by the same reference signs, and description thereof will be omitted. Furthermore, the encoding method of the embodiment is encoding processing of the encoding circuit 120 described below.

The encoding circuit 120 includes an operation control unit 20, a PS conversion unit 29y, the HD-FEC generation unit 24, an SD-FEC generation unit 25y, and a symbol mapping unit 27y. The PS conversion unit 29y includes the DM processing units 21a and 21b, a selector 22, and an XOR operator 23y. Note that, in the present embodiment, 64QAM is given as an example of the multi-level modulation scheme, but the multi-level modulation scheme is not limited to this.

The encoding circuit 120 performs switching between the bit string of a generation source of the SD-FEC parity and symbol mapping of the symbol mapping unit 27y for each of the periods Ta and Tb within the period T of the frame. For this reason, the operation control unit 20 performs switching of selectors (SELS) 22, 26a, and 26b in accordance with frame synchronization information input from, for example, the setting processing unit 15, and performs switching of the symbol mapping of the symbol mapping unit 27 between the Gray code or the Set-partitioning.

Each of the bit strings of level-0 to level-2 is input to the PS conversion unit 29y. The PS conversion unit 29y is an example of the conversion unit, and converts the value of each of the bit strings of level-0 and level-1 other than the bit string of level-1 so that a symbol closer to the center of the constellation is assigned more. The bit string of level-2, and the bit string of level-1 on which DM processing has been performed are input to the selector 22 and the HD-FEC generation unit 24. Note that, the bit string of level-2 is an example of a first bit string.

The selector 22 selects a bit string to be output to the XOR operator 23y from the bit strings of level-1 and level-2. In a case where the bit string of level-1 is selected, the bit string of level-1 is input from the DM processing unit 21a to the XOR operator 23y along a route R1a. At this time, the XOR operator 23y XORs the value of the bit string of level-1 with the value of the bit string of level-0, and the bit string of level-0 after the XOR is input to the HD-FEC generation unit 24.

In a case where the bit string of level-2 is selected, the bit string of level-2 is input to the XOR operator 23y along a route R1b. At this time, the XOR operator 23y XORs the value of the bit string of level-2 with the value of the bit string of level-0, and the bit string of level-0 after the XOR is input to the HD-FEC generation unit 24.

The HD-FEC generation unit 24 is an example of a second insertion unit, and generates an HD-FEC parity for correcting an error of each of the bit strings of level-0 to level-2 from the bit strings of level-0 to level-2, and inserts the HD-FEC parity into the bit string of level-2 during the period Ta. Note that, the HD-FEC parity is an example of the second error correction code.

The bit string of level-2 is input from the HD-FEC generation unit 24 to the selector 26a and the SD-FEC generation unit 25y, and the bit string of level-1 is input from the HD-FEC generation unit 24 to the selector 26b and the SD-FEC generation unit 25y, Furthermore, the bit string of level-0 is input from the HD-FEC generation unit 24 to the SD-FEC generation unit 25y.

The selector 26a selects, as a route of the bit string of level-2, a route R2a to the symbol mapping unit 27y via the SD-FEC generation unit 25y, or a route R2b to the symbol mapping unit 27y without passing through the SD-FEC generation unit 25y. In a case where the route R2b is selected, the SD-FEC generation unit 25y does not use the bit string of level-2 for generating the SD-FEC parity.

The selector 26b selects, as a route of the bit string of level-1, a route R3a to the symbol mapping unit 27y via the SD-FEC generation unit 25y, or a route R3b to the symbol mapping unit 27y without passing through the SD-FEC generation unit 25y. In a case where the route R3b is selected, the SD-FEC generation unit 25y does not use the bit string of level-1 for generating the SD-FEC parity.

The SD-FEC generation unit 25y is an example of a first insertion unit, and generates an SD-FEC parity for correcting an error of each of the bit strings of level-0 to level-2, and inserts the parity into the bit string of level-2. The SD-FEC parity is an example of a first error correction code.

In a case where the selector 26a selects the route R2a, the SD-FEC generation unit 25y inserts the SD-FEC parity into the bit string of level-2, and in a case where the selector 26a selects the route R2b, the SD-FEC generation unit 25y does not insert the SD-FEC parity. The SD-FEC parity is inserted during the period Ta within the period T of the frame, and is not inserted during the period Tb.

As described above, in the period T of the frame, the selector 26a performs switching between the period Ta in which the SD-FEC parity is inserted into the bit string of level-1 and the period Tb in which the SD-FEC parity is not inserted, Note that, the selector 26a is an example of a switching unit, the period Ta is an example of a first period, and the period Tb is an example of a second period.

Furthermore, in a case where the selector 26b selects the route R3a, the SD-FEC generation unit 25y generates an SD-FEC parity from the bit strings of level-0 and level-1, and in a case where the selector 26b selects the route R3b, the SD-FEC generation unit 25y generates the SD-FEC parity only from the bit string of level-0. As described above, the selector 26b selects the bit string of the generation source of the SD-FEC parity from the bit strings of level-0 and level-1. Note that, the selector 26b is an example of a selection unit.

The bit strings of level-2 and level-1 are input respectively from the selectors 26a and 26b to the symbol mapping unit 27y. Furthermore, the bit string of level-0 is input from the SD-FEC generation unit 25y to the symbol mapping unit 27y.

The symbol mapping unit 27y is an example of an assigning unit, and assigns symbols corresponding to values of the bit strings of level-0 to level-2, to the bit strings of level-0 to level-2 among the plurality of symbols in the constellation of 64QAM. The symbol mapping unit 27y switches the above-described symbol mapping of the symbol mapping units 27 and 27x in accordance with the periods Ta and Tb within the period T of the frame.

For example, the symbol mapping unit 27y uses the Gray code symbol mapping in the period Ta, and uses the Set-partitioning symbol mapping in the period Tb. Note that, data of the symbol mapping is stored in, for example, a memory in the symbol mapping unit 27y and the like.

The operation control unit 20 is an example of a control unit, and controls the selectors 22, 26a, and 26b, and the symbol mapping unit 27y depending on the periods Ta and Tb in accordance with the frame synchronization information. A reference numeral 92 indicates selection of the route of the selectors 22, 26a, and 26b for each of the periods Ta and Tb, and a map used by the symbol mapping unit 27y for symbol mapping, for example, a type of a correspondence relationship between the value of each of the bit strings and the symbol.

In accordance with the control of the operation control unit 20, during the period Ta, the selectors 22, 26a, and 26b select the routes R1a, R2a, and R1a, respectively, and the symbol mapping unit 27y uses the Gray code for symbol mapping. Furthermore, in accordance with the control of the operation control unit 20, during the period Tb, the selectors 22, 26a, and 26b select the routes R1b, R2b, and R3b, respectively, and the symbol mapping unit 27y uses the Set-partitioning for symbol mapping.

In the period Ta, the SD-FEC parity is therefore generated from the bit strings of level-0 and level-1 other than the bit string of level-2, and in the period Tb, the SD-FEC parity is generated from the bit string of level-0. For example, BICM is used in the period Ta, and MLC is used in the period Tb.

For this reason, the SD-FEC generation unit 25y sets a whole of the bit strings of level-0 to level-2 as a coding target area, in the period Ta, but sets only the level-0 bit string as an encoding target area, in the period Tb (see dotted frame). Thus, in the period Tb, a range of the generation source of the SD-FEC parity becomes narrower than in the case of BICM illustrated in FIG. 3, and power consumption is reduced.

Furthermore, since the SD-FEC parity is not inserted into the bit strings of level-0 and 1 other than the bit string of level-2, DM processing can be performed on the bit strings of level-0 and 1 in the periods Ta and Tb. Thus, the effect of noise immunity improvement by PS is not reduced.

Furthermore, in the PS conversion unit 29y, the bit string of level-0 is XORed with the bit string of level-1 in the period Ta, and the bit string of level-2 is XORed in the period Tb. Moreover, the symbol mapping unit 27y performs symbol mapping by the Gray code in the period Ta, and performs symbol mapping by the Set-partitioning in the period Tb.

As described above, the operation control unit 20 controls the symbol mapping unit 27y such that the correspondence relationship between the value of each of the bit strings of level-0 to level-2 and the symbol is different between the periods Ta and Tb, and controls the PS conversion unit 29y so that conversion processing of the value of each of the bit strings of level-0 and level-1 is switched depending on the above-described correspondence relationship. For this reason, the encoding circuit 120 can use the Gray code correspondingly to BICM in the period Ta, and can use the Set-partitioning correspondingly to MLC in the period Tb.

Furthermore, the HD-FEC generation unit 24 generates an HD-FEC parity and inserts the HD-FEC parity into the bit string of level-1. The HD-FEC parity is used in the decoding circuit 121 for error correction of the soft decision result of each of the bit strings of level-0 to level-2. On the other hand, the SD-FEC parity is used for error correction of the hard decision result of each of the bit strings of level-0 to level-2, in the decoding circuit 121.

Thus, the encoding circuit 120 uses the HD-FEC parity to enable error correction of an area other than the SD-FEC parity encoding target area while suppressing an increase in power consumption.

Figure 13:
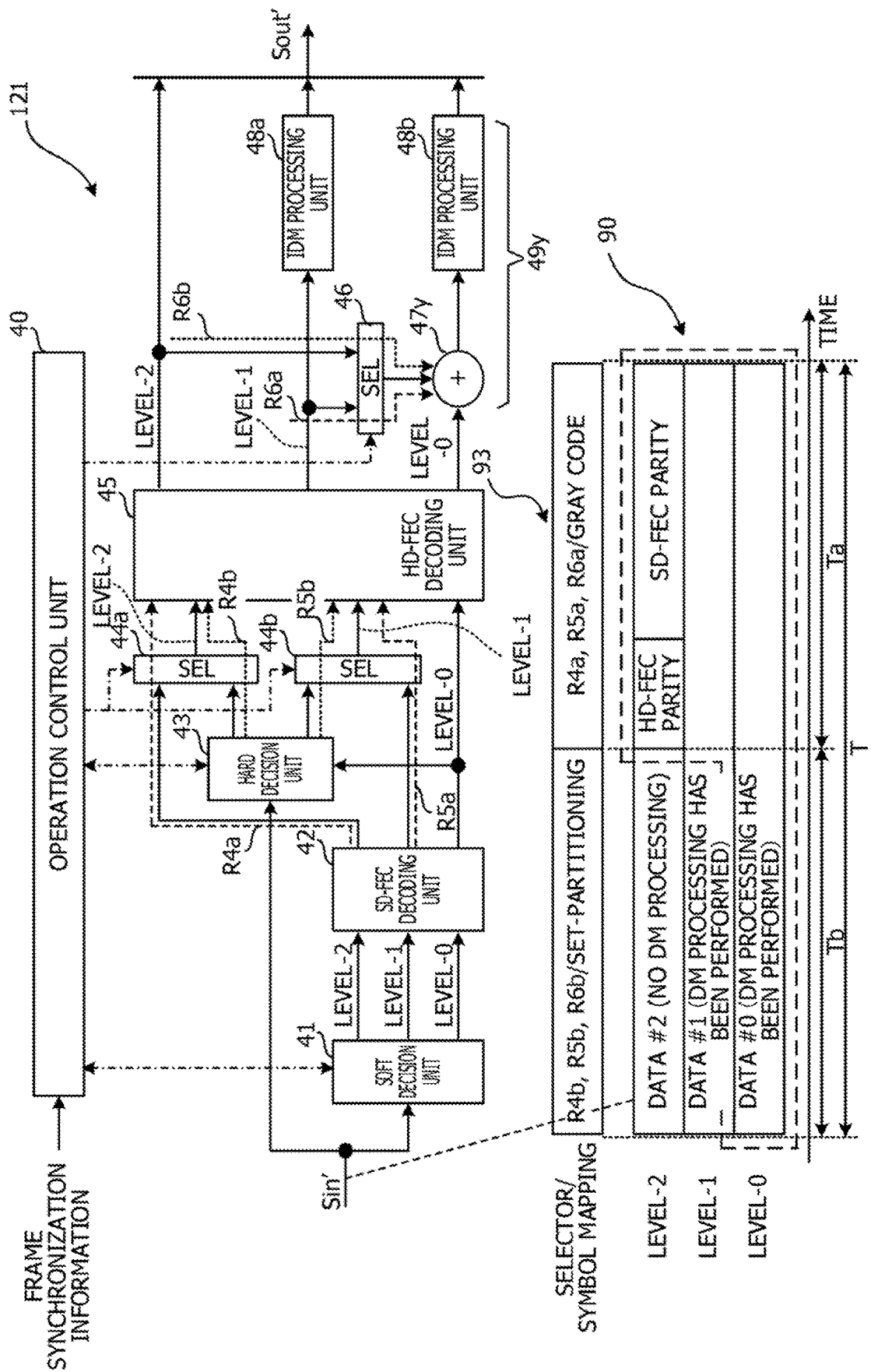
FIG. 13 is a configuration diagram illustrating a decoding circuit of the first embodiment.

FIG. 13 is a configuration diagram illustrating the decoding circuit 121 of the first embodiment. In FIG. 13, the same components as those in FIG. 4 are denoted by the same reference signs, and description thereof will be omitted. Furthermore, the decoding method of the embodiment is decoding processing of the decoding circuit 121 described below.

The decoding circuit 121 includes an operation control unit 40, the soft decision unit 41, the SD-FEC decoding unit 42, the hard decision unit 43, selectors 44a and 44b, the HD-FEC decoding unit 45, and a PS inverse conversion unit 49y. The PS inverse conversion unit 49y includes a selector 46, an XOR operator 47y, and the IDM processing units 48a and 48b.

The input signal Sin' is input from the analog-digital conversion unit 13 to the soft decision unit 41 and the hard decision unit 43 separately.

The soft decision unit 41 is an example of a first decision unit, and performs soft decision on each value of the bit strings of level-0 to level-2 in a frame to which symbols in the constellation of 64QAM are assigned on the basis of the symbols. The SD-FEC decoding unit 42 is an example of a correction unit, and corrects an error of the result of decision by the soft decision unit 41 on the basis of the SD-FEC parity inserted into the bit string of level-2 during the period Ta within the period T of the frame. For example, the SD-FEC decoding unit 42 decodes each of the bit strings of level-0 to level-2 on the basis of the SD-FEC parity.

The bit string of level-0 is input from the SD-FEC decoding unit 42 to the hard decision unit 43 and the HD-FEC decoding unit 45. The bit string of level-1 is input from the SD-FEC decoding unit 42 to the selector 44b. The bit string of level-2 is input from the SD-FEC decoding unit 42 to the selector 44a.

Furthermore, the hard decision unit 43 is an example of a second decision unit, and performs hard decision on the value of each of the bit strings of level-1 and level-2 other than the bit string of level-0 among the bit strings of level-0 to level-2 to which symbols in the constellation of 64QAM are assigned, on the basis of the symbols. The bit string of level-2 is input from the hard decision unit 43 to the selector 44a, and the bit string of level-1 is input from the hard decision unit 43 to the selector 44b. Note that, the bit string of level-0 is an example of a second bit string.

The selector 44a selects a route of the bit string of level-2 input to the HD-FEC decoding unit 45 from, a route R4a to the HD-FEC decoding unit 45 from the SD-FEC decoding unit 42, and a route R4b to the HD-FEC decoding unit 45 from the hard decision unit 43. Furthermore, the selector 44b selects a route of the bit string of level-1 input to the HD-FEC decoding unit 45 from, a route Rya to the HD-FEC decoding unit 45 from the SD-FEC decoding unit 42, and a route R5b to the HD-FEC decoding unit 45 from the hard decision unit 43.

The HD-FEC decoding unit 45 performs error correction of the value of each of the bit strings of level-0 to level-2 with the HD-FEC parity. For example, the HD-FEC decoding unit 45 decodes each of the bit strings of level-0 to level-2 on the basis of the HD-FEC parity. At this time, the HD-FEC decoding unit 45 maintains the error correction capability by performing multi-stage decoding. The HD-FEC decoding unit 45 outputs each of the bit strings of level-0 to level-2 to the PS inverse conversion unit 49y.

The PS inverse conversion unit 49y is an example of the inverse conversion unit, and performs inverse conversion of the value of each of the bit strings of level-0 and level-1 other than the bit string of level-2 converted by DM processing. The bit string of level-2 is input to the selector 46, and the bit string of level-1 is input to the selector 46 and the TOM processing unit 48a. Furthermore, the bit string of level-0 is input to the XOR operator 47y.

The selector 46 selects a bit string to be output to the XOR operator 47y from the bit strings of level-1 and level-2. In a case where the bit string of level-1 is selected, the bit string of level-1 is input from the HD-FEC decoding unit 45 to the XOR operator 47y along a route R6a. At this time, the XOR operator 47y XORs the value of the bit string of level-1 with the value of the bit string of level-0.

In a case where the bit string of level-2 is selected, the bit string of level-2 is input from the HD-FEC decoding unit 45 to the XOR operator 23y along a route R6b. At this time, the XOR operator 23y XORs the value of the bit string of level-2 with the value of the bit string of level-0.

The bit string of level-2 and each of the bit strings of level-0 and level-1 subjected to inverse-DM processing by the IDM processing units 48a and 48b are output to the framer chip 11, as the output signal Sout'.

In this configuration, the selectors 44a and 44b each select a bit string whose value is subjected to inverse conversion by the PS inverse conversion unit 49y from, the bit strings of level-2 and level-1 in which the error of the soft decision has been corrected by the SD-FEC parity, and the bit strings of level-2 and level-1 on which hard decision has been performed by the hard decision unit 43, Note that, the selectors 44a and 44b are examples of a bit string selection unit.

The operation control unit 40 is an example of a decoding control unit, and controls the selectors 44a, 44b, and 46b, the soft decision unit 41, and the hard decision unit 43 depending on the periods Ta and Tb in accordance with the frame synchronization information input from, for example, the soft decision unit 41 and the hard decision unit 43. A reference numeral 93 indicates selection of the route of the selectors 44a, 44b, and 46b for each of the periods Ta and Tb, and a map used by the soft decision unit 41 and the hard decision unit 43 for symbol demapping, for example, the type of the correspondence relationship between the value of each of the bit strings and the symbol.

In accordance with the control of the operation control unit 40, during the period Ta, the selectors 44a, 44b, and 46 select the routes R4a, Rya, and R6a, respectively, and the soft decision unit 41 and the hard decision unit 43 use the Gray code for symbol demapping. Furthermore, in accordance with the control of the operation control unit 40, during the period Tb, the selectors 44a, 44b, and 46 select the routes R4b, R5b, and R6b, respectively, and the soft decision unit 41 and the hard decision unit 43 use the Set-partitioning for symbol demapping.

In the period Ta, each of the bit strings of level-0 to level-2 on which error correction has been performed on the basis of the SD-FEC parity is therefore input to the HD-FEC decoding unit 45, and in the period Tb, each of the bit strings of level-1 and level-2 on which hard decision has been performed by the hard decision unit 43, and the bit string of level-0 on which error correction has been performed on the basis of the SD-FEC parity are input to the HD-FEC decoding unit 45.

For this reason, in each of the bit strings of level-0 to level-2 on which inverse conversion is performed by the PS inverse conversion unit 49y, a range of a decoding target of the SD-FEC parity changes depending on the periods Ta and Tb. Thus, the decoding circuit 121 can perform decoding of each of the bit strings correspondingly to the encoding circuit 120 of the first embodiment, and can reduce power consumption.

Furthermore, the XOR operator 47y XORs the bit string of level-1 with the bit string of level-0 in the period Ta, and XORs the bit string of level-2 with the bit string of level-0 in the period Tb. For this reason, the decoding circuit 121 can return each of the bit strings of level-0 to level-2 to the bit string before conversion by the PS conversion unit 29y.

Furthermore, the soft decision unit 41 and the hard decision unit 43 use the Gray code for symbol demapping in the period Ta, and use the Set-partitioning for symbol demapping in the period Tb. For this reason, the decoding circuit 121 can normally perform symbol demapping on each of the bit strings of level-0 to level-2 correspondingly to the symbol mapping unit 27y.

Second Embodiment

In the first embodiment, the frame in the case of using BICM is used, and the encoding processing and the decoding processing are switched between the period Ta in which the SD-FEC parity and the HD-FEC parity are inserted into the bit string of level-2, and the period Tb in which the SD-FEC parity and the HD-FEC parity are not inserted into the bit string of level-2. On the other hand, if the encoding circuit 120 does not use BICM and uses only MLC so that there is no need to switch the encoding processing and the decoding processing, power consumption can be further reduced as compared with the first embodiment by setting only the bit string of level-0 as an encoding target area.

However, since the SD-FEC parity and the HD-FEC parity are inserted into the bit string of level-2 at the subsequent stage of the PS conversion unit 29x, the XOR operator 23y performs XOR by using the uncertain bit string of level-1, whereby the probability distribution of symbol assignment is not formed normally. Note that, the reason why the SD-FEC parity and the HD-FEC parity are inserted into the bit string of level-2 at the subsequent stage of the PS conversion unit 29y is that the PS inverse conversion unit 49y of the decoding circuit 121 cannot perform inverse conversion normally if the bit string is not a bit string after error correction.

Thus, the encoding circuit 120 of the present embodiment delays the SD-FEC parity and the HD-FEC parity to insert them into the bit string of level-2 of the subsequent frame of each of the bit strings that are the generation source of the SD-FEC parity and the HD-FEC parity. XOR can therefore be performed by using the bit string of level-1 in which the determined SD-FEC parity and HD-FEC parity are inserted, so that the probability distribution of symbol assignment is formed normally.

Figure 14:
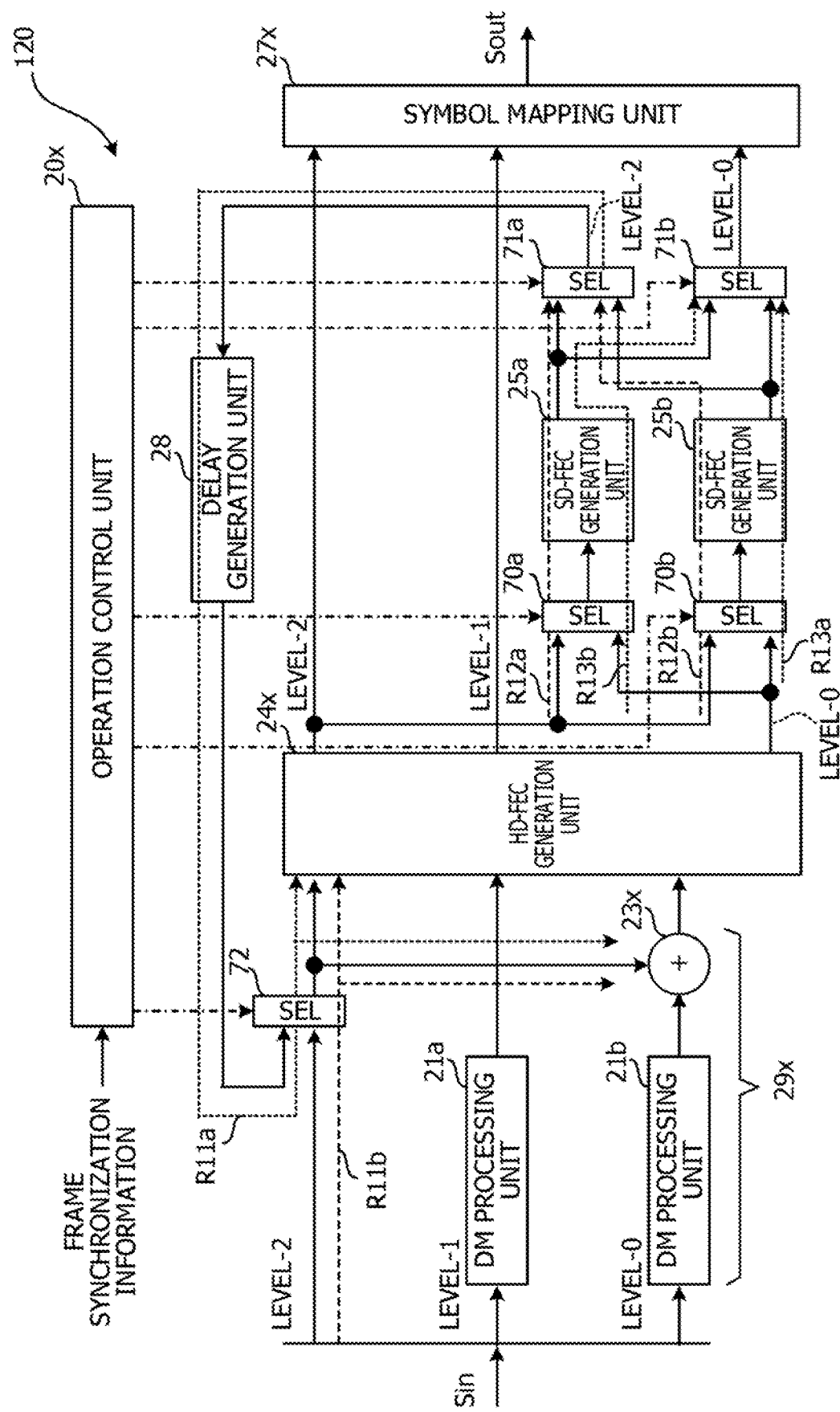
FIG. 14 is a configuration diagram illustrating an encoding circuit of a second embodiment.

FIG. 14 is a configuration diagram illustrating the encoding circuit 120 of a second embodiment. The encoding circuit 120 of the present embodiment is based on the encoding circuit 120 using MLC (see FIG. 8). Note that, in FIG. 14, the same components as those in FIG. 8 are denoted by the same reference signs, and description thereof will be omitted. Furthermore, the encoding method of the embodiment is encoding processing of the encoding circuit 120 described below.

The encoding circuit 120 includes an operation control unit 20x, the PS conversion unit 29x, the HD-FEC generation unit 24x, SD-FEC generation units 25a and 25b, the symbol mapping unit 27x, selectors 70a, 70b, 71a, 71b, and 72, and a delay generation unit 28. The PS conversion unit 29x includes the DM processing units 21a and 21b, and the XOR operator 23x. Note that, in the present embodiment, 64QAM is given as an example of the multi-level modulation scheme, but the multi-level modulation scheme is not limited to this.

The symbol mapping unit 27x is an example of the assigning unit, and assigns symbols corresponding to values of the bit strings in the frame to the bit strings of level-0 to level-2 among the plurality of symbols in the constellation of 64QAM. The symbol mapping unit 27x performs symbol mapping by Set-partitioning regardless of the periods Ta and Tb.

The PS conversion unit 29x is an example of a conversion unit, and converts the value of each of the bit strings of level-0 and level-1 other than the bit string of level-2 so that a symbol closer to the center of the constellation is assigned more. At this time, the XOR operator 47x converts the value of the bit string of level-0 by XORing by using the bit string of level-2.

The selector 72 selects a route of the bit string of level-2 input to the HD-FEC generation unit 24x and the XOR operator 23x from, a route R11a to the HD-FEC generation unit 24x and the XOR operator 23x without passing through the delay generation unit 28, and a route R11b to the HD-FEC generation unit 24x and the XOR operator 23x via the delay generation unit 28.

The delay generation unit 28 delays the bit string of level-2 output from the selector 71a by the frame period Tb. For this reason, in a case where the selector 72 selects the route R11a, the bit string of level-2 is inserted into the subsequent frame of the original frame.

Depending on selection by the selector 70a, one of the bit strings of level-0 and level-2 output from the HD-FEC generation unit 24x is input to the SD-FEC generation unit 25a. Depending on selection by the selector 70b, the other of the bit strings of level-0 and level-2 output from the HD-FEC generation unit 24x is input to the SD-FEC generation unit 25b.

The SD-FEC generation units 25a and 25b generate an SD-FEC parity only from the bit string of level-0. The SD-FEC parity is generated with only the bit strings of level-0 and level-1 as an encoding range by using MLC. Note that, the SD-FEC generation units 25a and 25b are examples of a generation unit.

The SD-FEC generation units 25a and 25b generate an SD-FEC parity from the bit string of level-0 input from the HD-FEC generation unit 24x. While the bit string of level-0 is being input to one of the SD-FEC generation units 25a and 25b, the other of the SD-FEC generation units 25a and 25b generates and outputs the SD-FEC parity to the delay generation unit 28.

The selector 71a selects an input source of the bit string of level-2 output to the delay generation unit 28 from the SD-FEC generation units 25a and 25b. The selector 71b selects an input source of the bit string of level-0 output to the symbol mapping unit 27x from the SD-FEC generation units 25a and 25b.

The selectors 70a, 70b, 71a, and 71b therefore select a route of the bit string of level-1 from a route R12a passing through the SD-FEC generation unit 25a, and a route R12b passing through the SD-FEC generation unit 25b. Furthermore, the selectors 70a, 70b, 71a, and 71b select a route of the bit string of level-0 from a route R13b passing through the SD-FEC generation unit 25a, and a route R13a passing through the SD-FEC generation unit 25b.

The operation control unit 20x is an example of the control unit, and controls the selectors 70a, 70b, 71a, 71b, and 72 depending on the periods Ta and Tb in accordance with the frame synchronization information.

Figure 15:
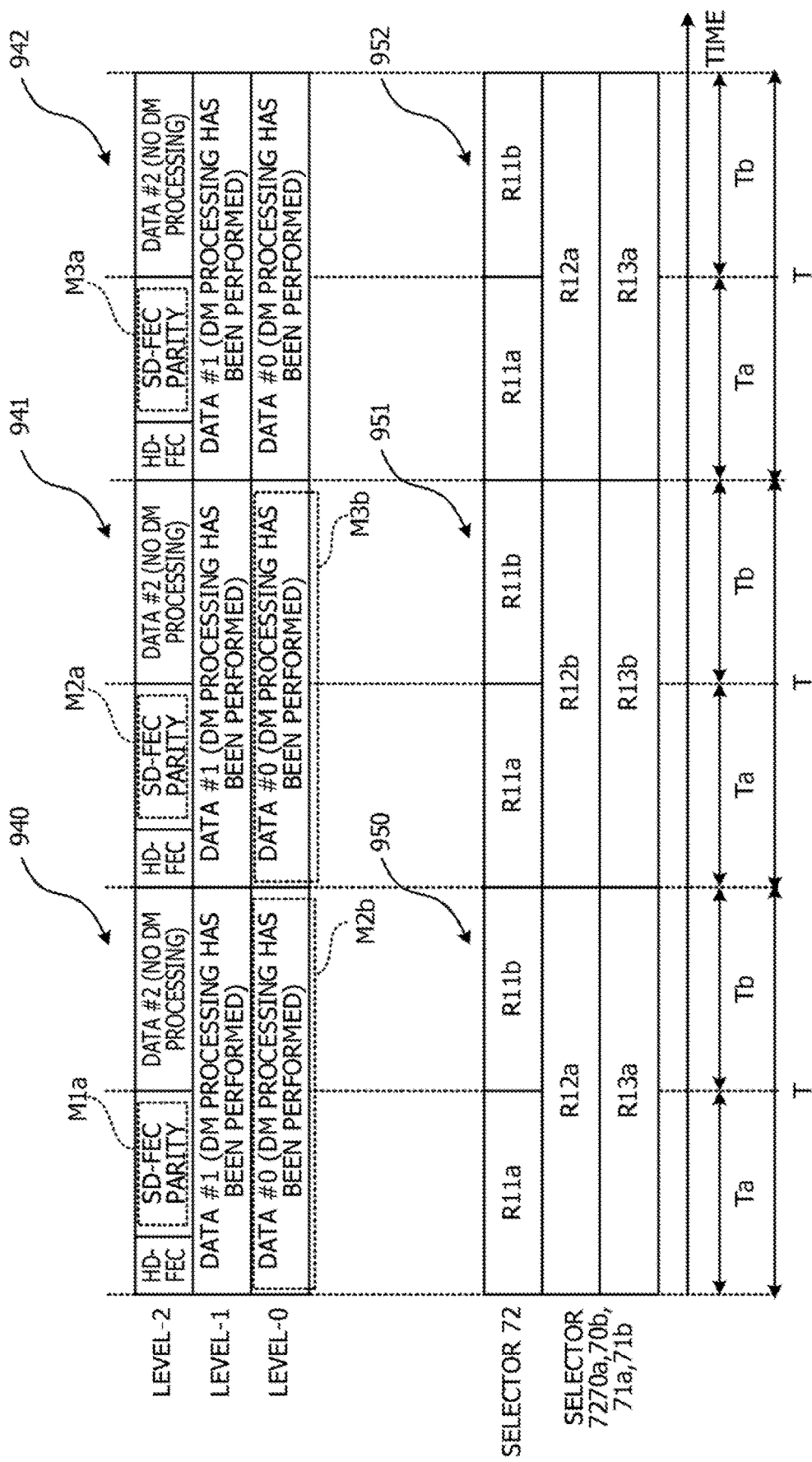
FIG. 15 is a time chart illustrating a control example of selectors in the encoding circuit.

FIG. 15 is a time chart illustrating a control example of the selectors 70a, 70b, 71a, 71b, and 72 in the encoding circuit 120. In three consecutive frames 940 to 942, HD-FEC parities and SD-FEC parities M1a to M3b are inserted into the bit strings of level-2, respectively, similarly to the first embodiment. The period T of each of the frames 940 to 942 includes a period Ta in which the HD-FEC parity and a corresponding one of the SD-FEC parities M1a to M3b are inserted, and a period Tb in which the data #2 is inserted.

Reference numerals 950 to 952 indicate routes selected by the respective selectors 70a, 70b, 71a, 71b, and 72 in accordance with the control of the operation control unit 20x within the periods T of the frames 940 to 942.

The selector 72 selects the route R11a in the period Ta and selects the route R11b in the period Tb in accordance with the control of the operation control unit 20x. For this reason, in the period Ta, the SD-FEC parities M1a to M3b are delayed by the period Tb by the delay generation unit 28, and inserted into the respective bit strings of level-2.

The SD-FEC parity M1a is generated from a bit string of level-0 in another frame preceding the frame 940 by one period T. The SD-FEC parity M2a is generated from a bit string M2b of level-0 in the other frame 940 preceding the frame 941 by one period T. The SD-FEC parity M1a is generated from a bit string M3b of level-0 in the other frame 941 preceding the frame 942 by one period T.

As described above, the delay generation unit 28 delays the SD-FEC parity, thereby inserting the SD-FEC parity into the bit string of level-0 in the subsequent frame of the generation source frame of the SD-FEC parity. Note that, the delay generation unit 28 is an example of a code insertion unit.

Furthermore, the PS conversion unit 29x uses the delayed SD-FEC parity for conversion of the value of the bit string of level-0 in the subsequent frame. For this reason, the PS conversion unit 29x can form an appropriate probability distribution of symbol assignment on the basis of the determined SD-FEC parity.

Furthermore, the selectors 70a, 70b, 71a, and 71b switch route selection for each of the frames 940 to 942 in accordance with the control of the operation control unit 20x. The selectors 70a, 70b, 71a, and 71b select the routes R12a and R13a within the periods T of the frames 940 and 942, and the selectors 70a, 70b, 71a, and 71b select the routes R12b and R13b within the period T of the frame 941.

In a case where the route Rita is selected, the SD-FEC generation unit 25a generates an SD-FEC parity from the bit string of level-0, and outputs the SD-FEC parity together with the HD-FEC parity input from the HD-FEC generation unit 24x to the delay generation unit 28. Furthermore, in a case where the route R12b is selected, the bit string of level-0 is input from the HD-FEC generation unit 24x to the SD-FEC generation unit 25b.

In a case where the route R13a is selected, the bit string of level-0 is input from the HD-FEC generation unit 24x to the SD-FEC generation unit 25b. Furthermore, in a case where the route R12b is selected, the SD-FEC generation unit 25b generates an SD-FEC parity from the bit string of level-0, and outputs the SD-FEC parity together with the HD-FEC parity input from the HD-FEC generation unit 24x to the delay generation unit 28.

As described above, the SD-FEC generation units 25a and 25b alternately generate the SD-FEC parity for each frame and output the SD-FEC parity to the delay generation unit 28. For this reason, the generation and output of the SD-FEC parity and the collection of the bit string of the generation source of the SD-FEC parity can be performed simultaneously and in parallel.

According to the encoding circuit 120 of the present embodiment, since the bit string of level-1 is not an encoding target of the SD-FEC parity, power consumption can be reduced as compared with the first embodiment. Furthermore, since the PS conversion unit 29x delays the SD-FEC parity so that the SD-FEC parity is inserted into the subsequent frame, the PS conversion unit 29x can form an appropriate probability distribution of symbol assignment on the basis of the determined SD-FEC parity. Thus, the effect of noise immunity improvement by PS is not reduced.

Figure 16:
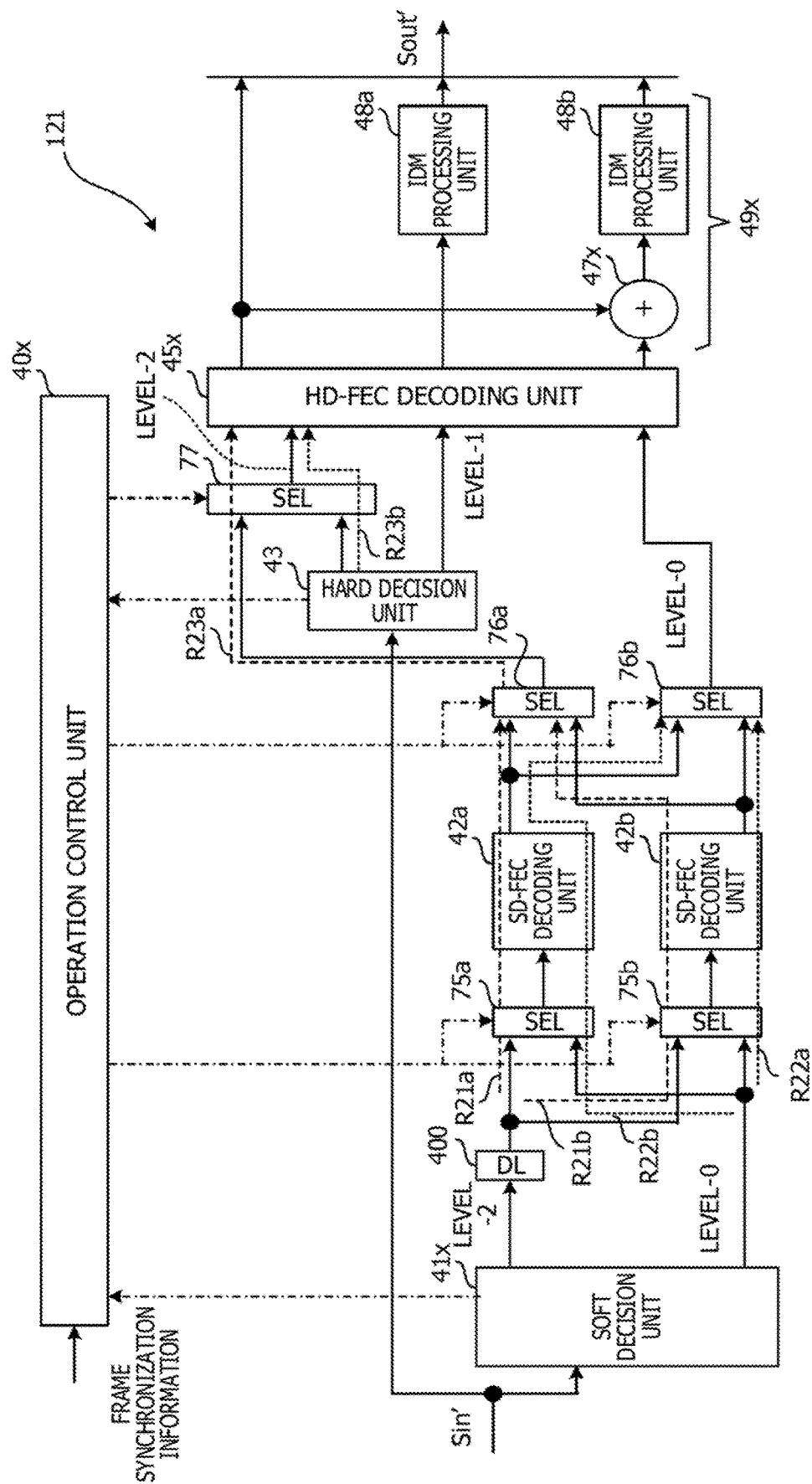
FIG. 16 is a configuration diagram illustrating a decoding circuit of the second embodiment.

FIG. 16 is a configuration diagram illustrating the decoding circuit 121 of the second embodiment. The decoding circuit 121 of the present embodiment is based on the decoding circuit 121 of FIG. 9. Note that, in FIG. 16, the same components as those in FIG. 9 are denoted by the same reference signs, and description thereof will be omitted.

Furthermore, the decoding method of the embodiment is decoding processing of the decoding circuit 121 described below.

The decoding circuit 121 includes an operation control unit 40x, a delay generation unit (DL) 400, the soft decision unit 41x, SD-FEC decoding units 42a and 42b, the hard decision unit 43, selectors 75a, 75b, 76a, 76b, and 77, and the HD-FEC decoding unit 45x, and the PS inverse conversion unit 49x. The PS inverse conversion unit 49x includes an XOR operator 47x and IDM processing units 48a and 48b.

The input signal Sin' is input to the soft decision unit 41x and the hard decision unit 43 separately. Here, it is assumed that, regarding the bit string of level-2 in the input signal Sin', the HD-FEC parity and the SD-FEC parity delayed by the encoding circuit 120 in FIG. 14 are inserted at positions before the delay.

The soft decision unit 41x is an example of a decision unit, and performs soft decision on values of the bit strings of level-0 and level-2 among the bit strings of level-0 to level-2 in a frame to which the plurality of symbols in the constellation of 64QAM is respectively assigned, on the basis of the symbols. The soft decision unit 41x outputs the bit string of the level-2 on which soft decision has been performed to the delay generation unit 400, and outputs the bit string of the level-0 on which soft decision has been performed to the selector 75b.

The delay generation unit 400 delays the bit string of level-2 so that the HD-FEC parity and the SD-FEC parity are inserted into the bit string of level-2 in the subsequent frame of the generation source frame. The delay generation unit 400 delays the bit string of level-2 so that the HD-FEC parity and the SD-FEC parity are delayed by the period Tb, similarly to the delay generation unit 28 of the encoding circuit 120. The delayed bit string of level-2 is input to the selector 75a.

The selector 75a selects a bit string to be input to the SD-FEC decoding unit 42a from the bit strings of level-0 and level-2, Furthermore, the selector 75b selects a bit string to be input to the SD-FEC decoding unit 42b from the bit strings of level-0 and level-2.

The SD-FEC decoding units 42a and 42b each are an example of the correction unit, and correct an error of the result of soft decision by the soft decision unit 41x on the basis of the SD-FEC parity inserted into the bit string of level-2. The SD-FEC decoding units 42a and 42b alternately perform acquisition and output of the bit string of level-0, and output of the HD-FEC parity and the SD-FEC parity, by switching selection of the selectors 75a and 75b.

The selector 76a selects an output source of the HD-FEC parity and the SD-FEC parity to be output to the selector 77, from the SD-FEC decoding units 42a and 42b. Furthermore, the selector 76b selects an output source of the bit string of level-0 to be output to the HD-FEC decoding unit 45x, from the SD-FEC decoding units 42a and 42b.

The selectors 75a, 75b, 76a, and 76b therefore select a route of the HD-FEC parity and the SD-FEC parity, from a route R21a passing through the SD-FEC decoding unit 42a, and a route R21b passing through the SD-FEC decoding unit 42b. Furthermore, the selectors 75a, 75b, 76a, and 76b select a route of the bit string of level-0 from a route R22b passing through the SD-FEC decoding unit 42a, and a route R22a passing through the SD-FEC decoding unit 42b.

The hard decision unit 43 performs hard decision on the values of the bit strings of level-1 and level-2 on the basis of the symbols. The bit string of level-1 on which hard decision has been performed is input to the HD-FEC decoding unit 45x, and the bit string of level-2 on which hard decision has been performed is input to the selector 77.

The selector 77 selects an output source of the bit string of level-2 to be output to the HD-FEC decoding unit 45x, from one of the SD-FEC decoding units 42a and 42b, and the hard decision unit 43. For example, the selector 77 selects a route of the bit string of level-2 from, a route R23a to the HD-FEC decoding unit 45x from one of the SD-FEC decoding units 42a and 42b, and a route R23b to the HD-FEC decoding unit 45x from the hard decision unit 43.

The operation control unit 40x controls the selectors 75a, 75b, 76a, 76b, and 77 depending on the periods Ta and Tb in accordance with the frame synchronization information.

FIG. 17 is a time chart illustrating a control example of the selectors 75a, 75b, 76a, 76b, and 77 in the decoding circuit 121. In FIG. 17, the same components as those in FIG. 15 are denoted by the same reference signs, and description thereof will be omitted.

Reference numerals 960 to 962 indicate routes selected by the respective selectors 75a, 75b, 76a, 76b, and 77 in accordance with the control of the operation control unit 20x within the periods T of the frames 940 to 942.

The selectors 75a, 75b, 76a, and 76b select the routes R21a and R22a within the periods T of the frames 940 and 942, and select the routes R21b and R22b within the period T of the frame 941 in accordance with the control of the operation control unit 40x. The SD-FEC decoding units 42a and 42b therefore perform acquisition and output of the bit string of level-0, and output of the HD-FEC parity and the SD-FEC parity, alternately, and perform error correction of the bit string of level-0 by the SD-FEC parity.

The selector 77 selects the route R23a in the period Ta and selects the route R23b in the period Tb in accordance with the control of the operation control unit 40x. The SD-FEC parity delayed by the delay generation unit 400 is therefore input from the HD-FEC decoding unit 45x to the PS inverse conversion unit 49x. For this reason, the PS inverse conversion unit 49x can use the SD-FEC parity delayed by the delay generation unit 400 for the inverse conversion of the value of the bit string of level-0 in the subsequent frame.

Thus, the decoding circuit 121 can decode the bit string of level-0 with the SD-FEC parity, and return the value of the bit string of level-0 converted by the PS processing to the value before the conversion, to correspond to the encoding circuit 120 of the second embodiment. The decoding circuit 121 does not perform the decoding processing of the bit string of level-1, so that power consumption can be further reduced as compared with the first embodiment.

Note that, the above-described encoding circuit 120 and decoding circuit 121 may be, for example, circuits including hardware such as a Field. Programmable Gate Array (FPGA) or an Application Specified Integrated Circuit (ASIC).

The embodiment described above is a preferred example. However, the present embodiment is not limited to this, and a variety of modifications can be made without departing from the scope of the present embodiment.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An encoding device comprising:

a memory; and circuitry coupled to the memory and configured to:

map symbols corresponding to values of a plurality of bit strings in a frame of a multi-level modulation scheme;

convert bit strings other than a first bit string included in the plurality of bit strings such that the mapped symbols are placed on a constellation points with unequal probabilities; and generate encoded bit strings using a first error correction code that is a code for correcting an error of the plurality of bit strings, wherein, the circuitry is further configured to:

select the first bit string as an insert bit string into which that the first error code is inserted during a first period in a period of the frame, select a second bit string from the converted bit strings, the second bit string being the insert bit string into which the first error code is inserted during a second period in the period of the frame, and perform switching to the first period from the second period, and/or from the first period to the second period, in a period of the frame.

2. The encoding device according to claim 1, wherein control is performed such that a correspondence relationship between the value of each of the plurality of bit strings and a plurality of symbols including the symbols differs between the first period and the second period, and control is performed such that conversion processing of the value of each of the bit strings other than the first bit string included in the plurality of bit strings switches depending on the correspondence relationship.

3. The encoding device according to claim 1, wherein the circuitry is configured to generate a second error correction code for correcting the error of the plurality of bit strings from each of the plurality of bit strings, and insert the second error correction code into the first bit string during the first period, the first error correction code is used for error correction of a soft decision result of the plurality of bit strings, and the second error correction code is used for error correction of a hard decision result of the plurality of bit strings.

4. An encoding device comprising:

a memory; and circuitry coupled to the memory and configured to:

map symbols corresponding to values of a plurality of bit strings in a frame of a multi-level modulation scheme;

convert bit strings other than a first bit string included in the plurality of bit strings such that the mapped symbols are placed on a constellation points with unequal probabilities; and generate an error correction code for correcting an error of a second bit string included in the plurality of bit strings; and inserts the error correction code into the first bit string included in the plurality of bit strings in a subsequent frame of the frame by delaying the error correction code, wherein the delayed error correction code is used for conversion of the second bit string included in the plurality of bit strings of the subsequent frame.

5. An encoding method comprising:

mapping symbols corresponding to of values of a plurality of bit strings in a frame of a multi-level modulation scheme;

converting bit strings other than a first bit string included in the plurality of bit strings such that the mapped symbols are placed on a constellation points with unequal probabilities; and generating encoded bit strings using a first error correction code that is a code for correcting an error of the plurality of bit strings, wherein the generating includes:

selecting the first bit string as an insert bit string into which that the first error correction code is inserted during a first period in a period of the frame; and selecting a second bit string from the converted bit strings, the second bit string being the insert bit string into which the first error code is inserted during a second period in the period of the frame.

6. The encoding method according to claim 5, wherein a correspondence relationship between the value of each of the plurality of bit strings and a plurality of symbols including the symbols is caused to differ between the first period and the second period, and conversion processing of the value of each of the bit strings other than the first bit string included in the plurality of bit strings is switched depending on the correspondence relationship.

7. The encoding method according to claim 5, wherein a second error correction code for correcting the error of the plurality of bit strings is generated from each of the plurality of bit strings, and the second error correction code is inserted into the first bit string during the first period, the first error correction code is used for error correction of a soft decision result of the plurality of bit strings, and the second error correction code is used for error correction of a hard decision result of the plurality of bit strings.

8. An encoding method comprising:

mapping symbols corresponding to values of a plurality of bit strings in a frame of a multi-level modulation scheme;

converting bit strings other than a first bit string included in the plurality of bit strings such that the mapped symbols are placed on a constellation is assigned points with unequal probabilities;

generating an error correction code for correcting an error of a second bit string included in the plurality of bit strings; and inserting the error correction code into the first bit string included in the plurality of bit strings in a subsequent frame of the frame by delaying the error correction code, wherein the delayed error correction code is used for conversion of a value of the second bit string included in the plurality of bit strings of the subsequent frame.

* * * * *